United States Patent [19]

Hieda

[11] Patent Number: 5,155,059

[45] Date of Patent: Oct. 13, 1992

[54] METHOD OF MANUFACTURING DYNAMIC RAM

[75] Inventor: Katsuhiko Hieda, Yokohama, Japan

[73] Assignee: Kabushiki Kaisha Toshiba, Kawasaki, Japan

[21] Appl. No.: 670,861

[22] Filed: Mar. 18, 1991

Related U.S. Application Data

[62] Division of Ser. No. 323,752, Mar. 15, 1989, Pat. No. 5,072,269.

[30] Foreign Application Priority Data

Mar. 15, 1988 [JP] Japan .................................. 63-61382
Mar. 29, 1988 [JP] Japan .................................. 63-75610
Sep. 30, 1988 [JP] Japan ................................. 63-246408

[51] Int. Cl.⁵ ..................... H01L 21/76; H01L 21/80; H01L 21/98
[52] U.S. Cl. ........................................ 437/52; 437/65
[58] Field of Search ................ 437/52, 65; 357/236 G

[56] References Cited

U.S. PATENT DOCUMENTS 4,737,829  4/1988  Morimoto et al. ............... 357/55
4,977,436 12/1990  Tsuchiya et al. ............... 357/23.6 G
5,001,526  3/1981  Goton ............................. 357/23.6 G

FOREIGN PATENT DOCUMENTS

| 198590 | 10/1986 | European Pat. Off. | ........ 357/23.6 G |
| 315803 | 5/1989 | European Pat. Off. | ........ 357/23.6 G |
| 62-114263 | 5/1987 | Japan | ............................ 357/23.6 G |
| 62-200758 | 9/1987 | Japan | ............................ 357/23.6 G |
| 63-66963 | 3/1988 | Japan | ............................ 357/23.6 G |
| 2-83968 | 3/1990 | Japan | ............................ 357/23.6 G |

Primary Examiner—Olik Chaudhuri
Assistant Examiner—G. Fourson
Attorney, Agent, or Firm—Oblon, Spivak, McClelland, Maier & Neustadt

[57] ABSTRACT

A semiconductor memory device includes a plurality of semiconductor pillar projections separated by grooves formed in longitudinal and transverse directions in a substrate and arranged in a matrix manner, a MOS capacitor and a MOSFET formed on side surfaces at lower and upper portions, respectively, of each pillar projection, a diffusion layer of a source or drain of each MOSFET formed in an upper end face of the pillar projection, and a bit line connected to the diffusion layer. The bit line is in contact with the upper end face of the pillar projection in a self-alignment manner.

5 Claims, 36 Drawing Sheets

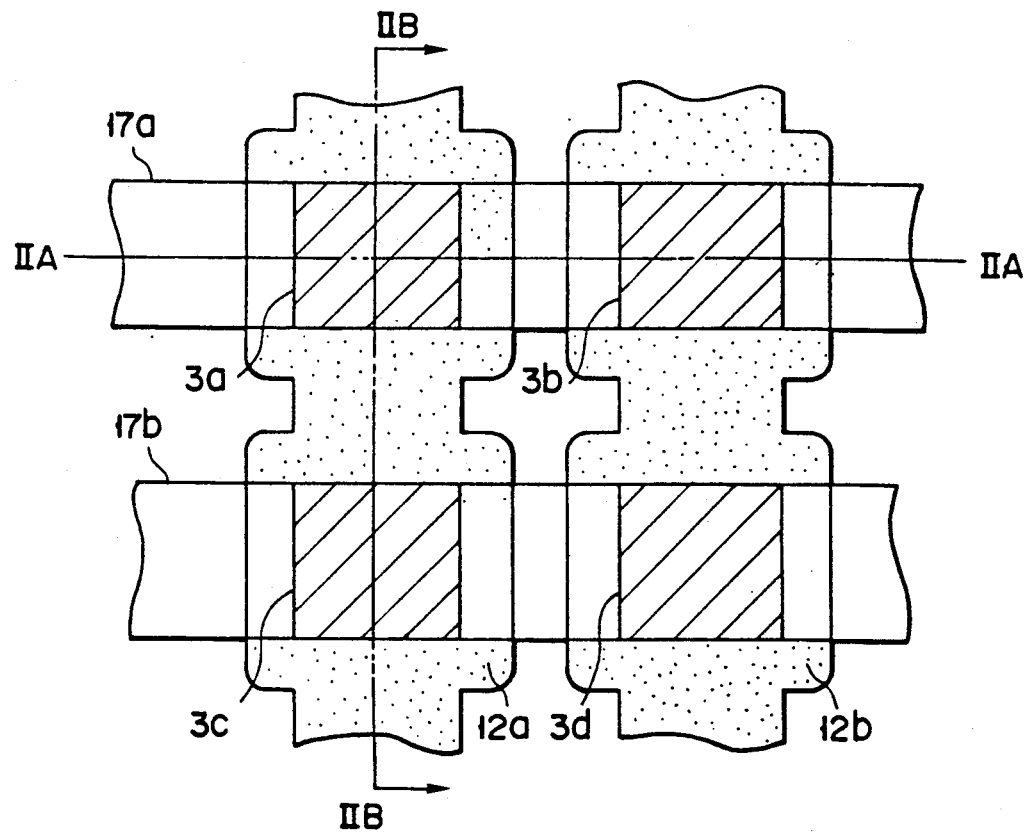
F I G. 1

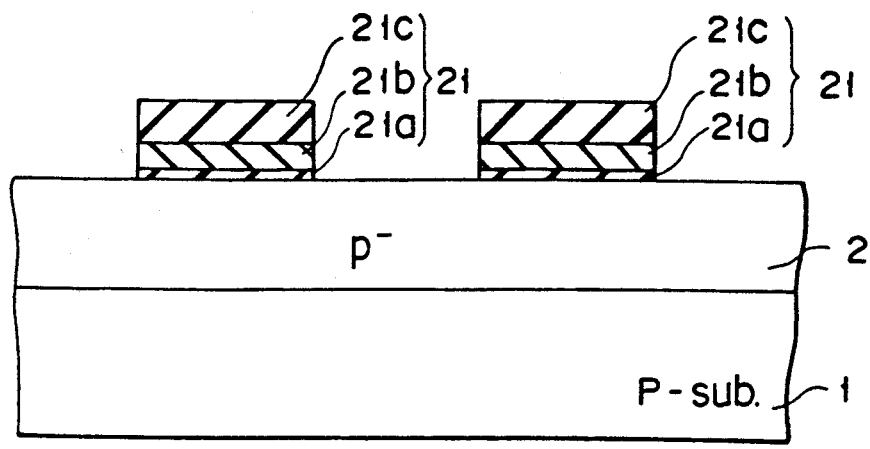
F I G. 3A
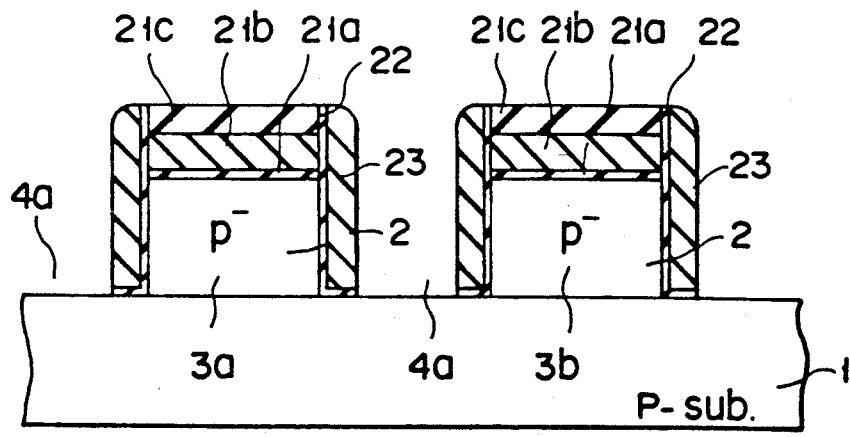
F I G. 3B

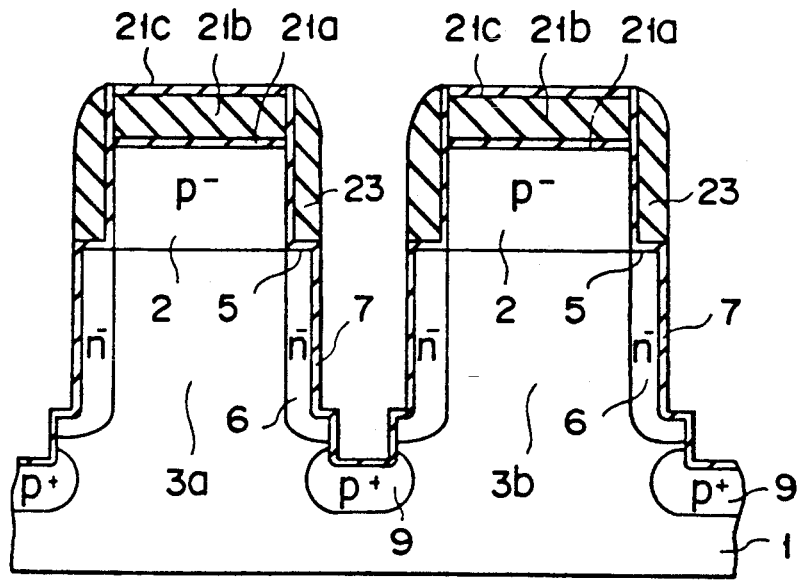
F I G. 3E
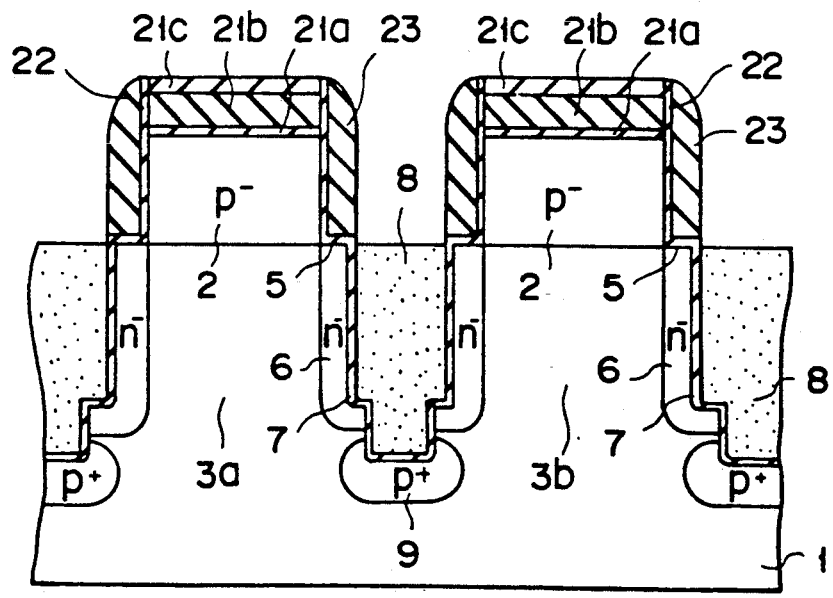
F I G. 3F

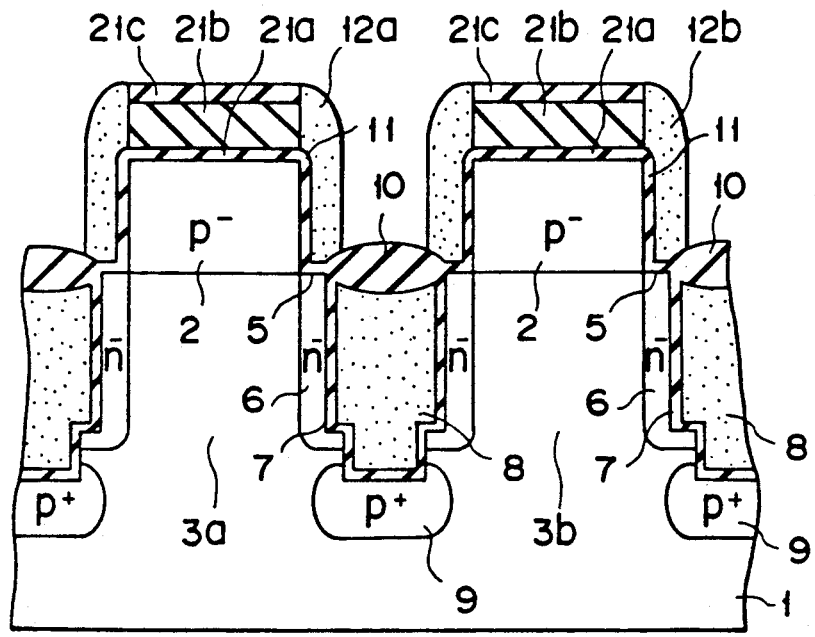
F I G. 3G
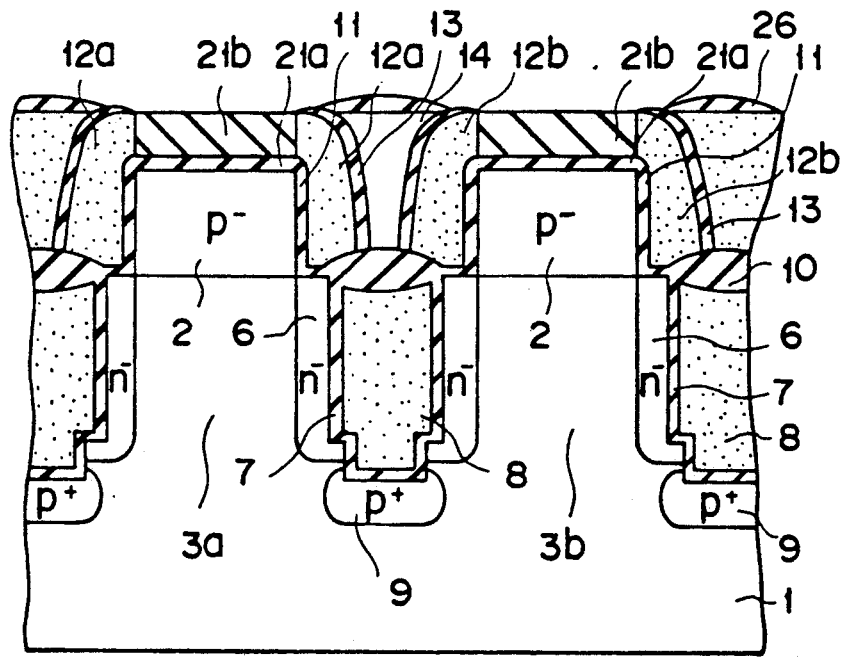
F I G. 3H

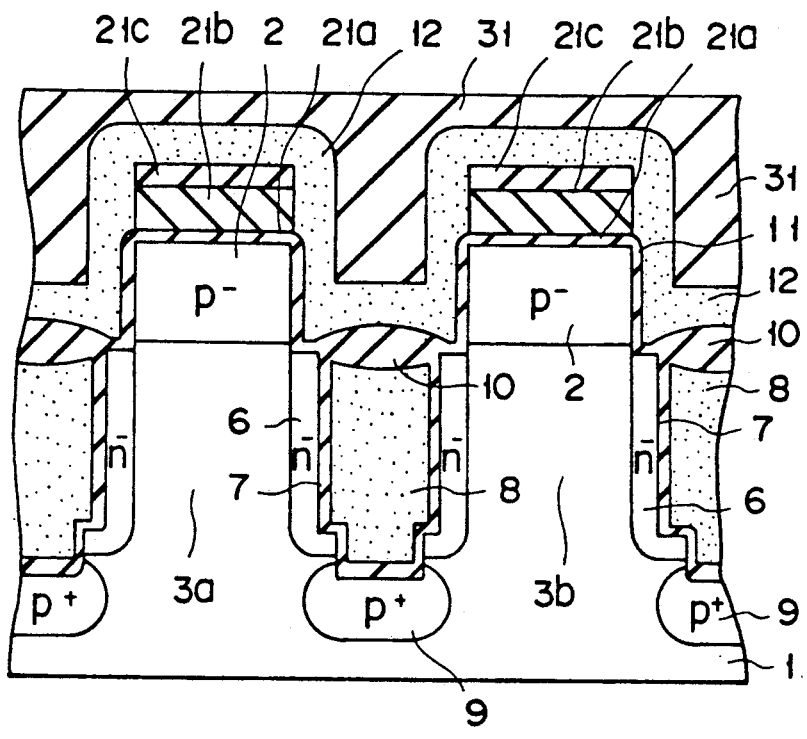
F I G. 5A
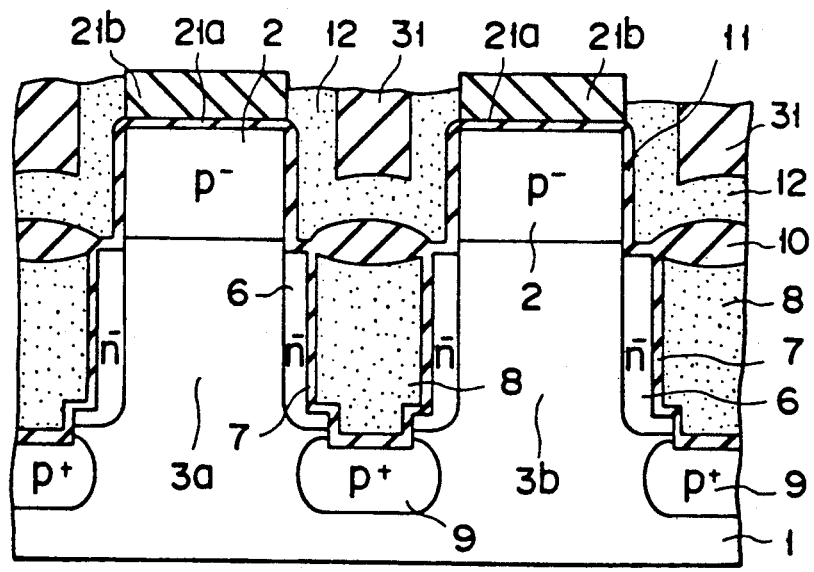
F I G. 5B

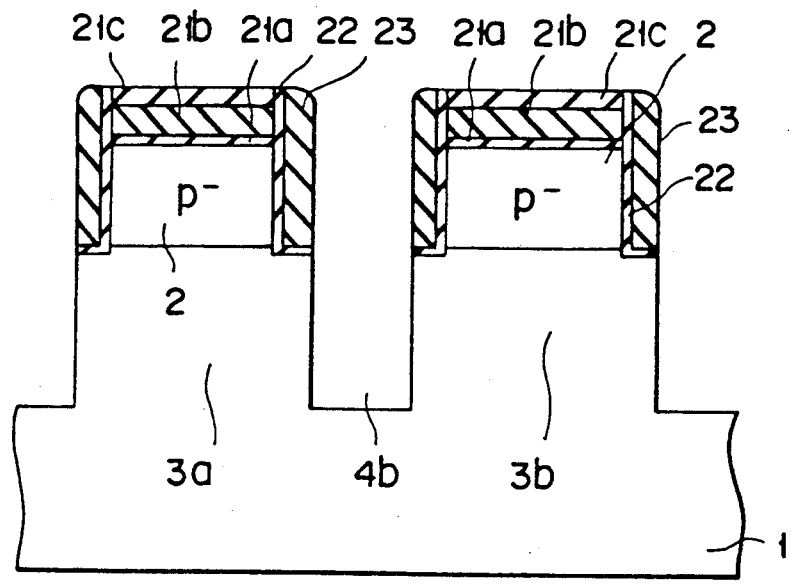
F I G. 7A
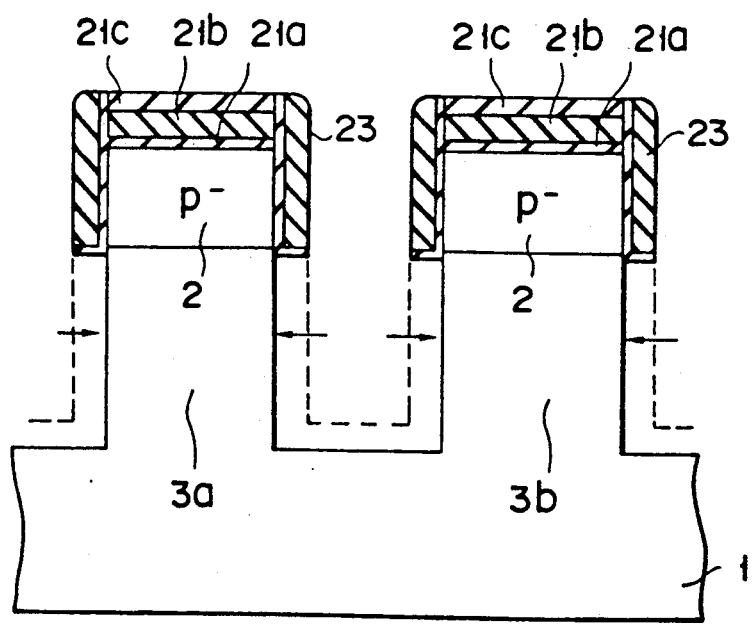
F I G. 7B

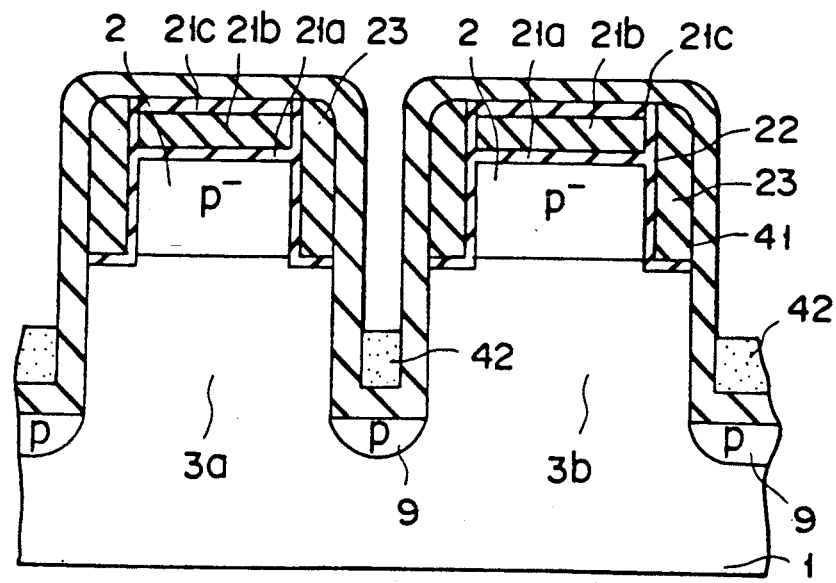
F I G. 8A
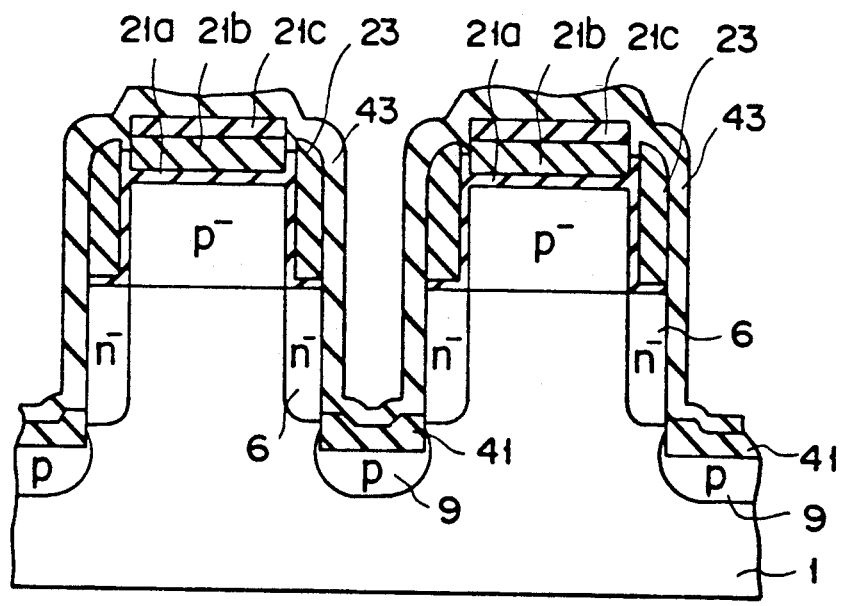
F I G. 8B

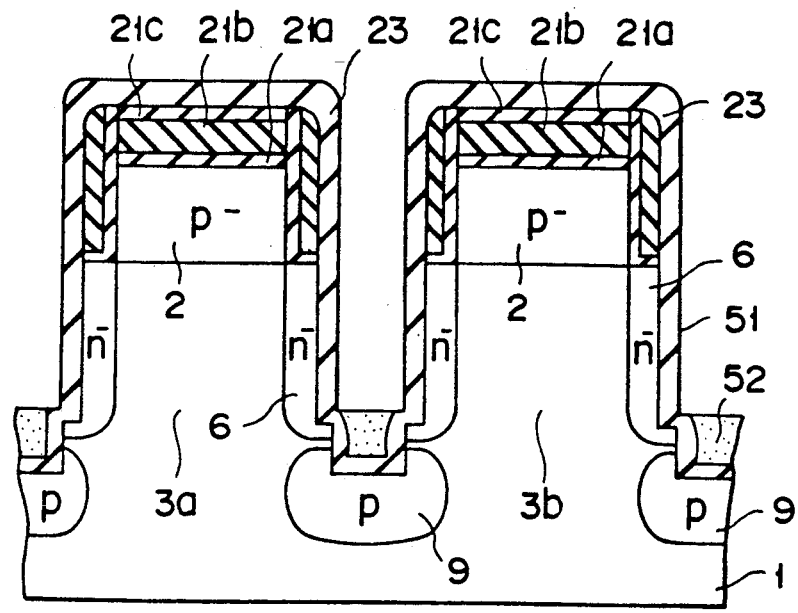
F I G. 9A
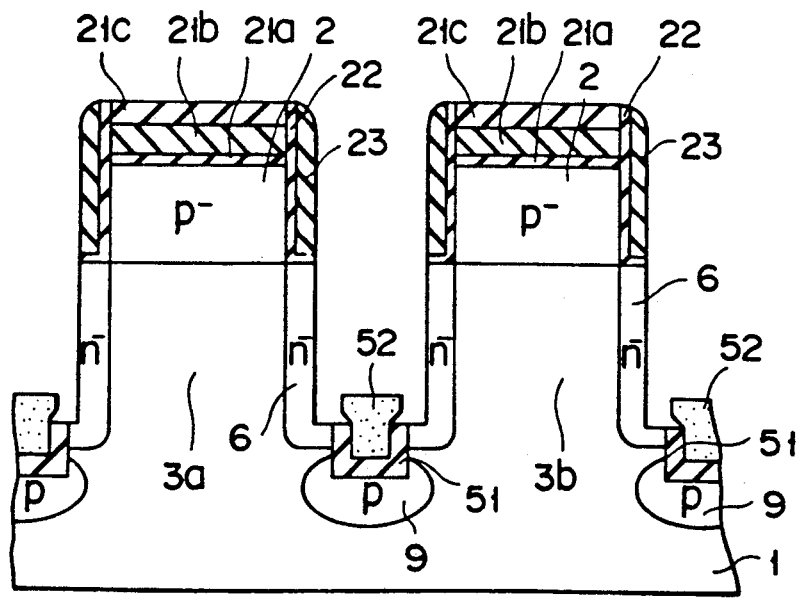
F I G. 9B

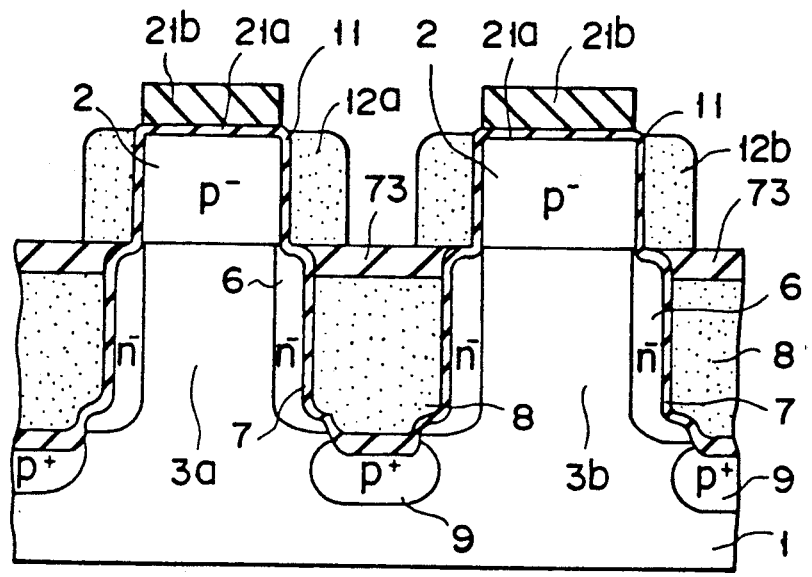
F I G. 13C
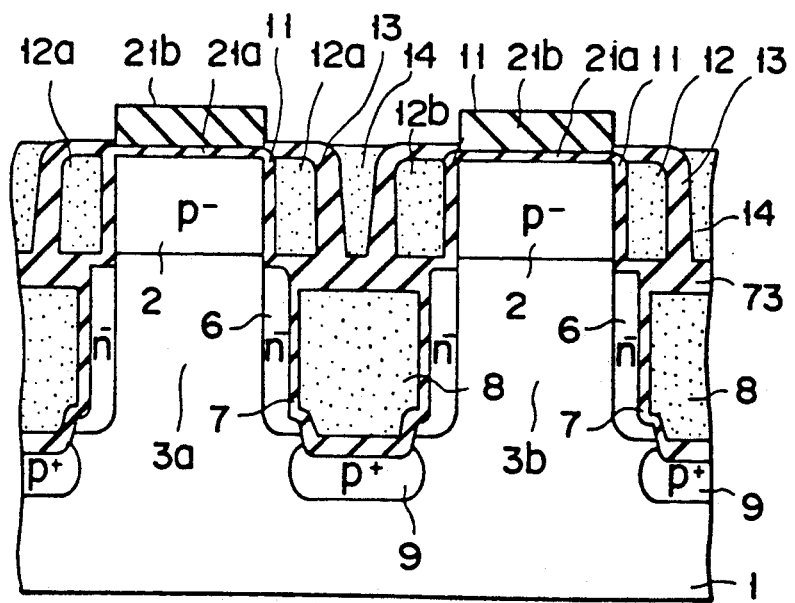
F I G. 13D

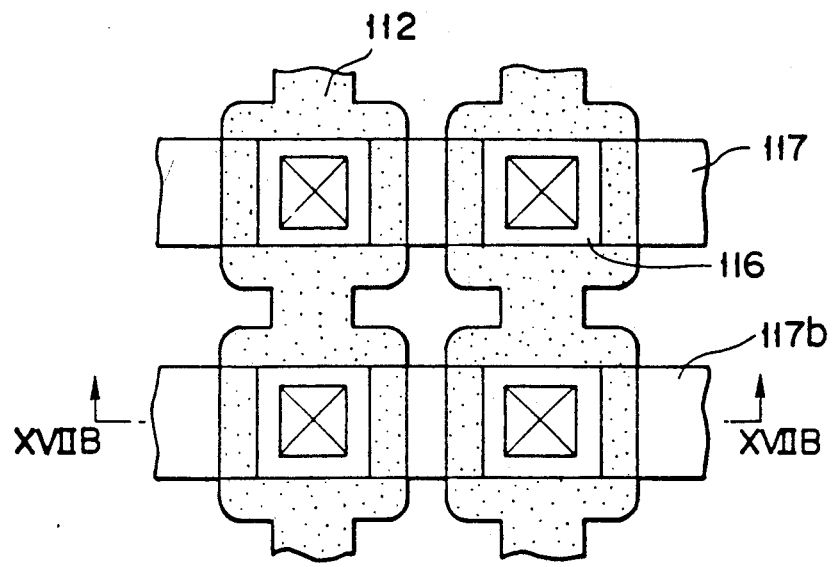
F I G. 17A
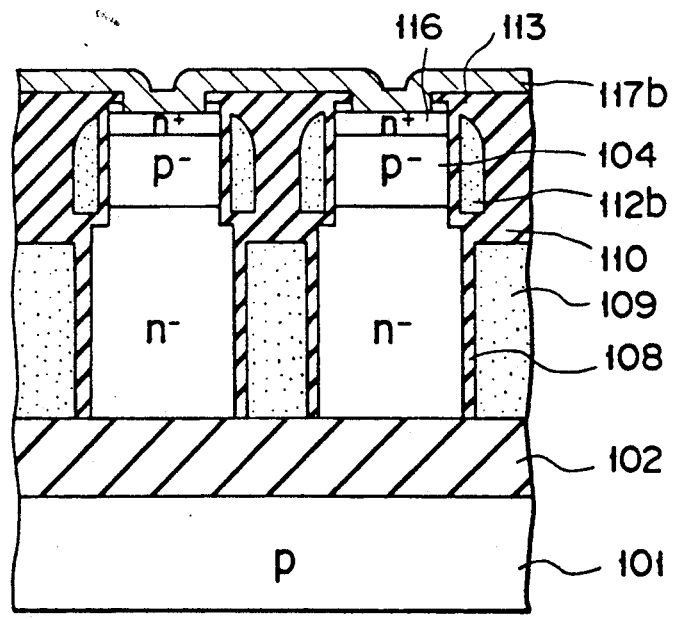
F I G. 17B

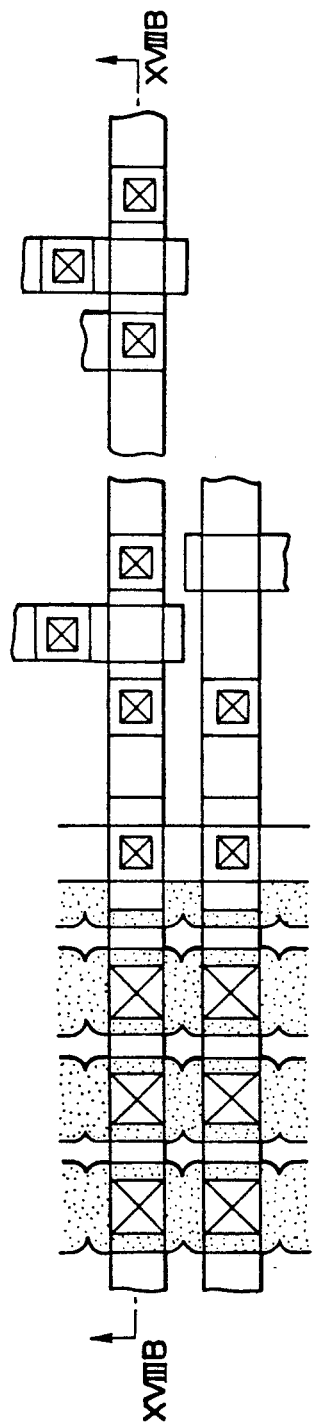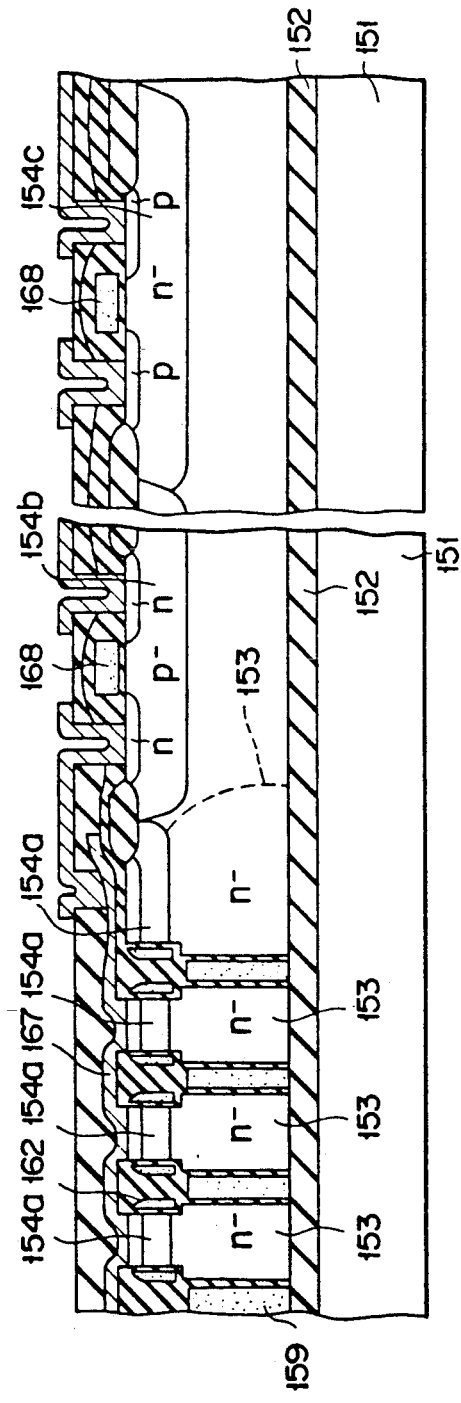
FIG. 18A
FIG. 18B

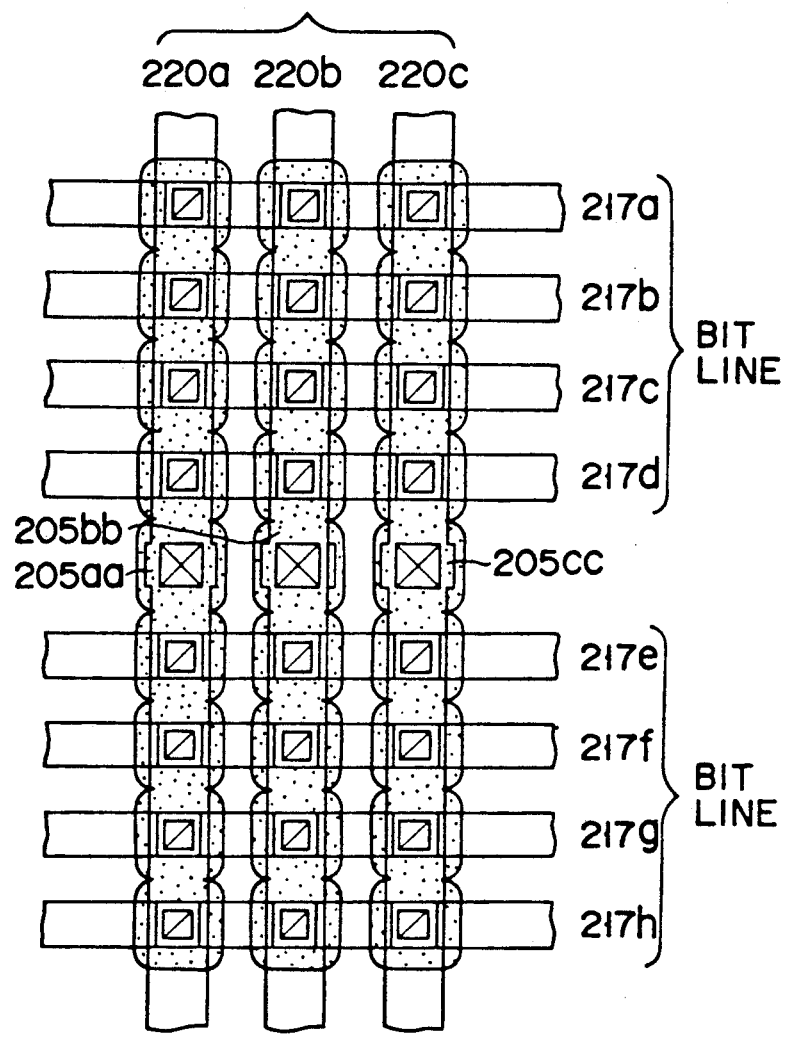
F I G. 21

METHOD OF MANUFACTURING DYNAMIC RAM

This is a division of application Ser. No. 07/323,752, filed on Mar. 15, 1989 now U.S. Pat. No. 5,072,269.

BACKGROUND OF THE INVENTION

1. Field of the Invention

The present invention relates to a dynamic RAM (DRAM) comprising a plurality of memory cells each constituted by a MOS capacitor and a MOSFET and a method of manufacturing the same.

2. Description of the Related Art

A high packing density and a large capacity of a MOS DRAM have progressed by micropatterning of elements. A DRAM structure suitable for a high packing density and a large capacity is disclosed in Japanese Patent Disclosure (Kokai) No. 60-152056. In this DRAM, grooves are formed in longitudinal and transverse directions in a semiconductor substrate. Semiconductor pillar projections are arranged in memory cell regions, respectively. A MOS capacitor is formed on side surfaces at a lower portion of each pillar projection, and a MOSFET is formed on side surfaces at an upper portion thereof. In the DRAM structure disclosed in Japanese Patent Disclosure (Kokai) No. 60-152056, a bottom portion of each groove serves as an element isolating region, and the MOS capacitor and the MOSFET are vertically stacked in the groove. Therefore, since an area occupied by a memory cell can be decreased, a high packing density can be obtained.

In the DRAM structure disclosed in Japanese Patent Disclosure (Kokai) No. 60-152056, however, a bit line is connected to an n-type layer formed on an upper end face of the pillar projection via a contact hole. For this reason, the size of the upper end face of each pillar projection is defined in accordance with a degree of an alignment margin between the bit line contact hole and the upper end face of the pillar projection. Therefore, even if a minimum design rule is used, an area of the upper end face of the pillar projection cannot be a minimum patterning size.

In addition, in order to form the MOS capacitor, an n-type layer which is one electrode of the capacitor and serves as a memory node is desirably formed in the semiconductor layer. In the DRAM structure disclosed in Japanese Patent Disclosure (Kokai) No. 60-152056, however, formation of this n-type layer is difficult because the capacitor must be formed on the side surfaces at the lower portion of the pillar projection before a gate electrode of the MOSFET is formed. In order to selectively dope an impurity in the side surfaces of a capacitor region, a MOSFET formation region must be covered with some kind of a mask. After formation of the grooves, however, it is difficult to adopt such a manufacturing step.

Recently, one of most serious problems in a DRAM is a soft error phenomenon. In the soft error phenomenon, a storage state in a memory cell changes upon incidence of rays, and an error occurs.

Since each memory cell is formed on the side surfaces of the pillar projection, rays which are obliquely incident are interrupted by an array of the pillar projections. As a result, a soft error in a cell mode is reduced. Since no insulating film is present right just below the pillar projections, however, rays incident from right just above cannot be suppressed. Therefore, a soft error must be reduced.

In the DRAM structure disclosed in Japanese Patent Disclosure (Kokai) No. 60-152056, however, an insulating layer is buried in the bottom portion of each pillar projection. It is difficult to manufacture a DRAM by this method. That is, in order to isolate adjacent MOS capacitors, an element isolating insulating film is formed on the bottom of the groove, but it is very difficult to bury such an insulating film on the bottom of a narrow groove having a high aspect ratio.

In addition, in the DRAM structure disclosed in Japanese Patent Disclosure (Kokai) No. 60-152056, a gate electrode material remains on a side wall of a step present at an end portion of a memory cell array. Since a step is also present on a groove formation portion, the gate electrode material remains on the side wall of the step when it is subjected to anisotropic etching (RIE). Each word line is short-circuited due to the residual gate electrode material.

In order to solve this problem, a method of etching and removing the gate electrode material remaining in a region between adjacent word lines by using conventional photolithography has been proposed.

An interval between the adjacent word lines, however, is minimum. Therefore, it is difficult to form an etching window considering an alignment margin in the region between the adjacent word lines.

As a result, the size of a memory cell is increased.

SUMMARY OF THE INVENTION

It is a first object of the present invention to provide a DRAM capable of realizing a higher packing density and a larger capacity and a method of manufacturing the same.

It is a second object of the present invention to provide a DRAM with few soft errors and a method of manufacturing the same.

It is a third object of the present invention to provide a DRAM capable of preventing an electrical short-circuit between word lines at an end portion of a memory cell array and having high reliability and a method of manufacturing the same.

A first DRAM according to the present invention is characterized by a structure in which a plurality of semiconductor pillar projections are arranged on a substrate in a matrix manner, a MOS capacitor and a MOSFET are formed at lower and upper portions of side surfaces of each pillar projection, respectively, thereby constituting a memory cell, a source or drain diffusion layer of the MOSFET is formed at an upper end face of the pillar projection, and a bit line is connected to the source or drain diffusion layer, and wherein the bit line is in contact with the upper end face of the pillar projection in a self-alignment manner without forming a contact hole.

A second DRAM according to the present invention has the above basic structure and is characterized in that a step is formed in the middle of the side surfaces of the pillar projection, a diffusion layer serving as a memory node is formed on side surfaces at a lower portion of the step, and a capacitor electrode is formed on the side surfaces at the lower portion with a capacitor insulating film interposed therebetween.

A first manufacturing method according to the present invention is a method of manufacturing a DRAM having a structure in which a plurality of semiconductor pillar projections are arranged on a substrate in a matrix manner, a MOS capacitor and a MOSFET are formed at lower and upper portions of side surfaces of each pillar projection, respectively, thereby constituting a memory cell, a source or drain diffusion layer of the MOSFET is formed at an upper end face of the pillar projection, and a bit line is connected to the source or drain diffusion layer, wherein a first mask including an anti-oxidation film is formed on a semiconductor substrate, and first grooves are formed in longitudinal and transverse directions in the substrate by anisotropic etching, thereby arranging a plurality of pillar projections. A second mask including an anti-oxidation film is formed on side surfaces of each pillar projection, and anisotropic etching is performed by using the first and second masks, thereby forming second grooves in the substrate. With the first and second masks being present, a MOS capacitor is formed on side surfaces of a lower portion of the pillar projection. At this time, by using the second mask, a diffusion layer serving as a memory node is formed on the side surfaces at the lower portion of the pillar projection. A capacitor electrode is buried to reach the second groove. Thereafter, the second mask is removed to form a gate electrode on the side surfaces at an upper portion of the pillar projection with a gate insulating film interposed therebetween. Only the upper end face of the pillar projection is exposed by removing the first mask while the entire surface is covered with the insulating film, and a diffusion layer serving as a source or drain of the MOSFET is formed on the exposed upper end face. In addition, a bit line to be connected to the upper end face is formed.

According to the present invention, an anti-oxidation mask is used as the first mask for groove formation and remains until a final step of element formation. Therefore, a bit line contact region is formed in a self-alignment manner at the upper end face of the pillar projection. As a result, a memory cell can be micropatterned, and a high packing density and a large capacity of the DRAM can be realized. In addition, since an area of the substrate concerning a soft error is reduced by micropatterning, a soft error in a bit line mode can be suppressed. Also, since each memory is formed on the side surfaces of the pillar projection and α-rays incident obliquely are interrupted by an array of the pillar projections, a soft error in a cell mode can be similarly suppressed. Furthermore, a step is formed on the side surfaces of the pillar projection by the two-step groove formation using the first and second masks, and the diffusion layer serving as a memory node is formed in side surfaces at a lower portion of the step. Therefore, a DRAM cell having excellent characteristics can be obtained.

A third DRAM according to the present invention is a semiconductor memory device in which grooves are formed in longitudinal and transverse directions in a substrate, a plurality of semiconductor pillar projections isolated by the grooves are arranged in a matrix manner, a MOS capacitor and a MOSFET are formed at lower and upper portions of each pillar projection, respectively, and a bit line is connected to the source or drain of the MOSFET, wherein each pillar projection is formed on an insulating layer buried in the substrate.

A fourth DRAM according to the present invention is characterized by a structure in which a plurality of semiconductor pillar projections are arranged in a matrix manner on a substrate having therein an insulating film layer for isolating a MOS capacitor, an impurity layer serving as a memory node, and an impurity layer serving as a channel region of a MOSFET, and in which a MOS capacitor and a MOSFET are formed at lower and upper portions of each pillar projection, respectively, thereby constituting a memory cell, a source or drain diffusion layer of the MOSFET is formed in an upper end face of the pillar projection, and a bit line is connected to the upper end face, wherein bit line is in contact with the upper end face of the pillar projection in a self-alignment manner without forming a contact hole.

A fifth DRAM according to the present invention has the above basic structure and is characterized in that a step is formed in the middle of the side surfaces of the pillar projection, a semiconductor layer serving as a memory node is formed from the step or a portion slightly above the step to the entire surface at the lower portion, and a capacitor electrode is buried therein with a capacitor insulating film interposed therebetween.

A second manufacturing method according to the present invention comprises a step of bonding first and second substrates, each of the first and second substrates having on its surface an oxide film and an impurity layer if necessary, by using a wafer bonding technique such that the oxide films are sandwiched therebetween.

According to the above arrangement, each pillar projection is formed on an insulating layer buried in the substrate. Therefore, rays incident from right just above each memory cell are interrupted by this insulating layer, and those incident obliquely are interrupted by an array of the pillar projections. As a result, a soft error rate can be largely reduced.

According to a method of the present invention, a bonded wafer is used as a starting material, grooves are formed in longitudinal and transverse directions from a first substrate side by anisotropic etching using an oxide film as an etching stopper to form a plurality of semiconductor pillar projections isolated by the grooves, and a MOS capacitor and a MOSFET are formed at lower and upper portions of each pillar projection, respectively. Therefore, the grooves having a uniform depth can be easily formed at a high integration density. In addition, the pillar projections are formed such that all of their bottom surfaces are present on the insulating film.

According to the present invention, an antioxidation mask is used as the first mask and remains until a final step of element formation. Therefore, a bit line contact region can be formed in a self-alignment manner on the upper end face of the pillar projection without an alignment margin for the bit line contact. As a result, the memory cell can be micropatterned, and a high packing density and a large capacity of the DRAM can be realized. In addition, since an area of the substrate concerning a soft error is reduced, a soft error in a bit line mode can be suppressed. Also, since each memory cell is formed on the side surfaces of the pillar projection and α-rays incident obliquely are interrupted by an array of the pillar projections, a soft error in a cell mode can be equally suppressed.

By the two-step groove formation using the first and second masks, especially by the second grooves reaching the insulating layer in the substrate, the MOS capacitors can be completely isolated. Therefore, since a step of forming an impurity film can be omitted by using a step of forming the insulating film on the bottom of the groove for isolation, a DRAM can be manufactured very easily.

A sixth DRAM according to the present invention is a semiconductor memory device having a structure in which grooves are formed in longitudinal and transverse directions in a substrate, a plurality of semiconductor pillar projections isolated by the grooves are arranged in a matrix manner, a MOS capacitor and a MOSFET are formed at lower and upper portions of each pillar projection, respectively, and a bit line is connected to the source or drain of the MOSFET, wherein specific pillar projections located every arbitrary number of bits are used as word line extracting contact pillar projections, a conductor layer is formed above an upper surface of each specific pillar projection, with an insulating layer thicker than a gate insulating film of the MOSFET interposed therebetween, so as to be used as a contact pad and is connected to a gate electrode of adjacent cells.

Preferably, each pillar projection is formed on the insulating layer buried in the substrate.

In the above basic structure, each arbitrary projection constituting a cell is formed such that a bit line is connected to an upper end face of each pillar projection in a self-alignment manner without forming a contact hole.

A seventh DRAM according to the present invention has the above basic structure and is characterized in that a step is formed in the middle of the side surfaces of each pillar projection, a diffusion layer serving as a memory node is formed on the entire surface at a lower portion of the step, and a capacitor electrode is buried in the side surfaces at the lower portion with a capacitor insulating film interposed therebetween.

A third manufacturing method according to the present invention is a method of manufacturing a semiconductor device in which grooves are formed in longitudinal and transverse directions in a substrate, a plurality of semiconductor pillar projections isolated by the grooves are formed in a matrix manner, a MOS capacitor and a MOSFET are formed at lower and upper portions of each pillar projection, respectively, and a bit line is connected to the source or drain of the MOSFET, wherein at least one of masks used in formation of the grooves remains in units of blocks, and a mask is formed on each pillar projection when a gate electrode is formed in a self-alignment manner on the side surfaces at the upper portion of the pillar projection so that a gate electrode material remains to be used as a word line contact region.

According to the present invention, first and second substrates, each having on its surface an oxide film and a desired impurity layer, are bonded by using a wafer bonding technique such that the oxide films are sandwiched therebetween, thereby forming a bonded wafer as a starting material. The oxide film (insulating film), the impurity layer serving as a memory node, and the impurity layer serving as a channel of a MOSFET are sequentially formed on the semiconductor substrate. Grooves are formed in longitudinal and transverse directions from a first substrate side by anisotropic etching using the oxide film as an etching stopper to form a plurality of semiconductor projections isolated by the grooves. A MOS capacitor and a MOSFET are formed at lower and upper portions of each semiconductor projection, respectively, and a bit line is connected to the source or drain of the MOSFET.

In the above arrangement, a word line extracting contact pad is not formed at an end portion of a memory cell array, but specific pillar projections located every arbitrary number of bits are used as word line extracting contact pillar projections. A conductor layer is formed above an upper surface of each specific pillar projection, with the insulating layer interposed therebetween, so as to be used as a contact pad. Therefore, a word line need not be extended to the end portion of the memory cell array beyond a step of the groove but may be stopped at a side wall of the pillar projection adjacent to the end portion of the memory cell array.

In the conventional structure, a word line is extended to the end portion of the memory cell array beyond the step of the groove and is extracted from the end portion. Therefore, a word line material (gate electrode material) remains in the step portion of the groove. In the above structure of the present invention, however, even when a cell interval is decreased, no short-circuiting occurs between the word lines to improve the reliability.

In addition, since the contact pad connected to the gate electrode is formed on the upper surface of the specific pillar projection with the thick insulating layer interposed therebetween, no gate breakdown occurs in a high electric field generated during formation of the gate electrode.

Also, unlike in the conventional structure, a photolithograpic step for removing the word line material (gate electrode material) remaining in the step portion of the groove at the end portion of the memory cell array need not be performed to prevent short-circuiting between the word lines, resulting in easy manufacture. In addition, since no alignment margin for mask alignment is required, a memory cell size can be further reduced.

Furthermore, according to the present invention, since the word line is not extracted from the end portion of each block, but the specific pillar projection located at the center of each block is used as a contact pad, a delay on each word line can be prevented.

In the above arrangement, each pillar projection is formed on the insulating layer buried in the substrate. Therefore, electron-hole pairs generated by rays incident from right just above each memory cell are interrupted by the insulating layer, and rays incident obliquely are interrupted by an array of the pillar projections. As a result, a soft error rate can be largely reduced.

According to the third method of the present invention, the bonded wafer is used as a starting material, the grooves are formed in longitudinal and transverse directions from the first substrate side by anisotropic etching using the oxide film as an etching stopper to form a plurality of semiconductor pillar projections isolated by the grooves, and the MOS capacitor and the MOSFET are formed at the lower and upper portions of each pillar projection, respectively. Therefore, the grooves having a uniform depth can be easily formed at a high integration density. In addition, the pillar projections are formed such that all of their bottom surfaces are present on the insulating film.

According to the present invention, an anti-oxidation mask is used as the first mask for groove formation and remains until a final stage of element formation. Therefore, a bit line contact region is self-aligned on the upper end face of the pillar projection, and no alignment margin for the bit line contact is required. As a result, a memory cell can be micropatterned, and a high packing density and a large capacity of the DRAM can be realized. In addition, since an area of the substrate concerning a soft error can be reduced by micropatterning, a soft error in a bit line mode can be suppressed. Also, since each memory cell is formed on the side surfaces of the pillar projection and α-rays incident obliquely are interrupted by an array of the pillar projections, a soft error in a cell mode can be equally suppressed.

Furthermore, the MOS capacitor is completely isolated by the second groove reaching the insulating layer on the substrate. Therefore, since a step of an impurity layer can be omitted by using a step of forming the insulating film on the bottom of the groove for isolation, a DRAM can be manufactured very easily.

BRIEF DESCRIPTION OF THE DRAWINGS

Other objects and advantages will be apparent from the following description taken in conjunction with the accompanying drawings, in which:

FIG. 1 is a plan view showing a DRAM according to a first embodiment of the present invention;

FIGS. 3A to 3I are sectional views showing a method of manufacturing the DRAM according to the first embodiment;

FIGS. 5A to 5E are sectional views showing a method of manufacturing a DRAM according to a modification of the present invention;

FIGS. 7A and 7B are sectional views showing a method of manufacturing a DRAM capable of preventing a step from being formed on side surfaces of a pillar projection;

FIGS. 8A to 8C are sectional views showing a method of manufacturing a DAM capable of improving element isolation;

FIGS. 9A and 9B are sectional views showing a method of manufacturing a DRAM capable of improving element isolation according to still another modification of the present invention;

FIGS. 13A to 13F are sectional views for explaining a DRAM manufacturing method using an isolating insulating film different from that of the first embodiment in order to insulatively isolate a capacitor electrode from a gate electrode;

FIG. 17A is a plan view showing a DRAM according to still another modification of the present invention;

FIG. 17B is a sectional view taken along a line XVIIB—XVIIB in FIG. 17A;

FIG. 18A is a plan view showing the DRAM formed by the present invention and its peripheral circuits;

FIG. 18B is a sectional view taken along a line XVIIIB—XVIIIB in FIG. 18A;

FIG. 21 is a plan view showing a DRAM according to still another modification of the present invention.

DETAILED DESCRIPTION OF THE PREFERRED EMBODIMENTS

Figure 2A:
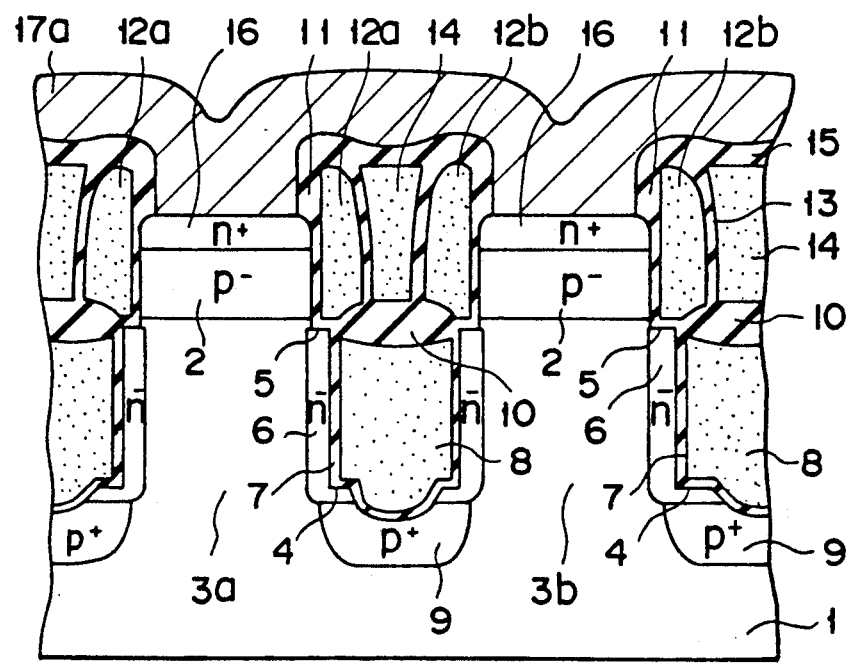
FIG. 2A is a sectional view taken along a line IIA—IIA in FIG. 1.
Figure 2B:
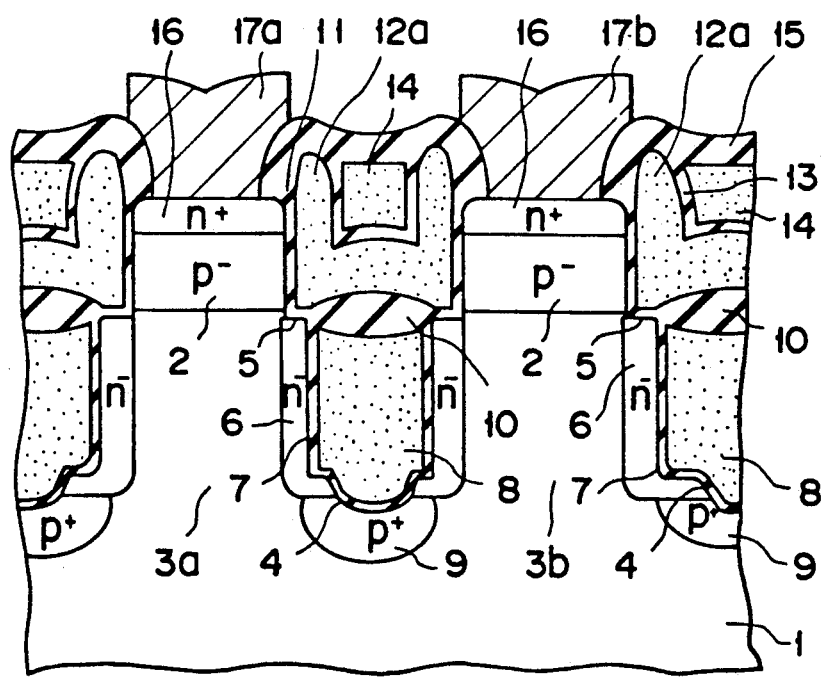
FIG. 2B is a sectional view taken along a line IIB—IIB in FIG. 1.

FIG. 1 is a plan view showing four bits of a DRAM according to a first embodiment of the present invention. Referring to FIGS. 1 and 2, a $p^-$-type layer 2 having a higher impurity concentration than that of a p-type Si substrate 1 having a high resistivity is formed on the surface of the substrate 1. The layer 2 serves as a channel region of a MOSFET. Small pillar projections 3a, 3b, 3c and 3d isolated by grooves 4 formed in longitudinal and transverse directions are arranged in a matrix manner on the substrate. A step 5 is formed on side surfaces of each projection 3. An $n^-$-type layer 6 serving as a memory node is formed on the side surfaces below the step 5. A capacitor insulating film 7 is formed on the side surfaces, and a capacitor electrode 8 is buried in the groove 4. The layer 6 is formed to substantially coincide with or to be deeper than a level of the side surfaces at an upper portion of the step 5. The capacitor electrode 8 is continuously formed as a plate electrode common for all memory cells. A $p^+$-type layer 9 for element isolation is diffused in a bottom portion of the groove. Gate electrodes 12a and 12b are formed above the side surfaces above the step 5 of each pillar projection 3 with a gate insulating film 11 interposed therebetween. Each gate electrodes 12a, 12b are insulatively isolated from the capacitor electrode 8 by an insulating film 10 in the groove 4. The gate electrode 12 and the capacitor electrode 8 are vertically stacked and buried. The gate electrodes 12a and 12b surround the projection 3 and are formed continuously in one direction of the matrix to serve as a word line. A polycrystalline silicon film 14 is buried in the recess portion except for the electrodes 12a and 12b with an insulating film 13 interposed therebetween. As a result, the recess portion is flattened. The surface of the substrate in which the capacitor and gate electrodes are buried is covered with an insulating film 15, and bit lines 17a and 17b including a polycrystalline silicon film doped with, for example, As, and a tungsten silicide film are formed thereon. An $n^+$-type layer 16 serving as a source or drain of the MOSFET is formed in an upper end face of each projection 3 by diffusion. The bit line 17 is directly connected to the layer 16 in a self-alignment manner without a PEP step for forming a contact hole.

Figure 3C:
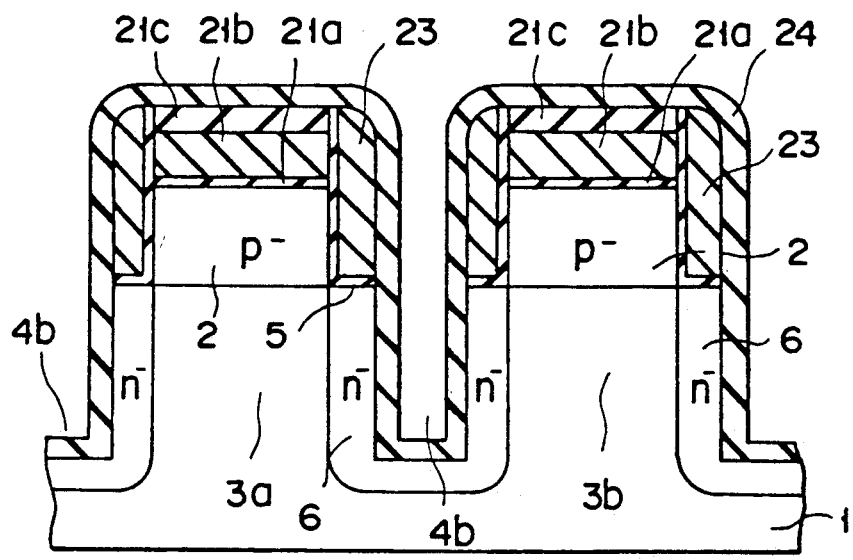

A method of manufacturing the above DRAM will be described below with reference to FIGS. 3A to 3I. As shown in FIG. 3A, boron ions are implanted in the p-type Si substrate 1 at a dose of $5 \times 10^{12}$ ions/cm$^2$ and an acceleration voltage of 100 keV, thereby forming the p-type layer 2 of a high impurity concentration. The layer 2 serves to form a channel region of a MOSFET and has a thickness of about 2 μm. The layer 2 may be formed by epitaxial growth in place of ion implantation. A first mask 21 is formed on the substrate by conventional photolithography to cover each memory cell region. More specifically, the first mask 21 consists of a 10-nm thick SiO$_2$ film 21a formed by thermal oxidation, a 200-nm thick Si$_3$N$_4$ film 21b as an anti-oxidation film and a 600-nm thick SiO$_2$ film 21c deposited by CVD.

As shown in FIG. 3B, first grooves 4a are formed to extend through the p$^-$-layer 2 by reactive ion etching (RIE) using the first mask as an etching mask. A plurality of pillar projections 3 are arranged by these grooves 4a. Thereafter, an Si$_3$N$_4$ film 23 serving as a second anti-oxidation mask is formed on side surfaces of each projection 3. More specifically, a 20-nm thick SiO$_2$ film 22 is deposited by CVD, and a 200-nm thick Si$_3$N$_4$ film 23 is deposited thereon by the CVD. These stacked films are caused to remain only on the side surfaces of the projection 3 by anisotropic etching such as RIE.

As shown in FIG. 3C, by using the first and second masks as anti-etching masks, a 3-μm thick second groove 4b is formed in the first groove 4a by RIE using chlorine gas. In this manner, the step 5 is formed on the side surfaces of each pillar projection 3. Thereafter, predetermined processing is performed to the etched surface, and a 50-nm thick glass film containing arsenic, e.g., an AsSG film 24 is deposited on the entire surface by CVD. Annealing is performed at 1,000° C. for 60 minutes to diffuse As contained in the film 24 into the side surfaces at a lower portion not covered with the mask, thereby forming the n$^-$-type layer 6 serving as one electrode of a capacitor and a memory node. At this time, a surface impurity concentration of the layer 6 is set to be, e.g., $1 \times 10^{19}$ atoms/cm$^3$. Although not shown, boron ions, for example, may be obliquely implanted to form a p-type layer at an outer circumferential portion of the layer 6, so that the capacitor obtains an HiC structure.

Figure 3D:
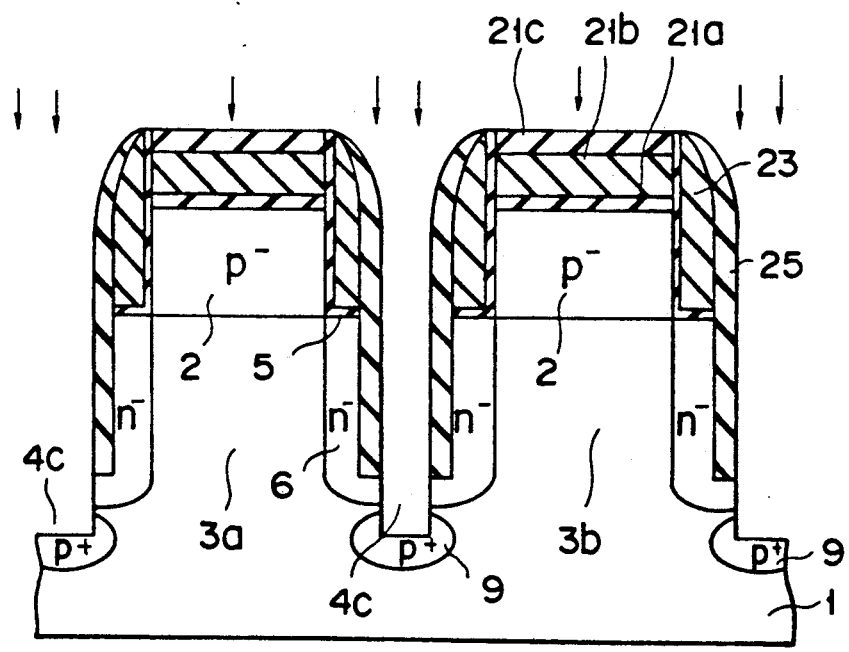
Figure 31:
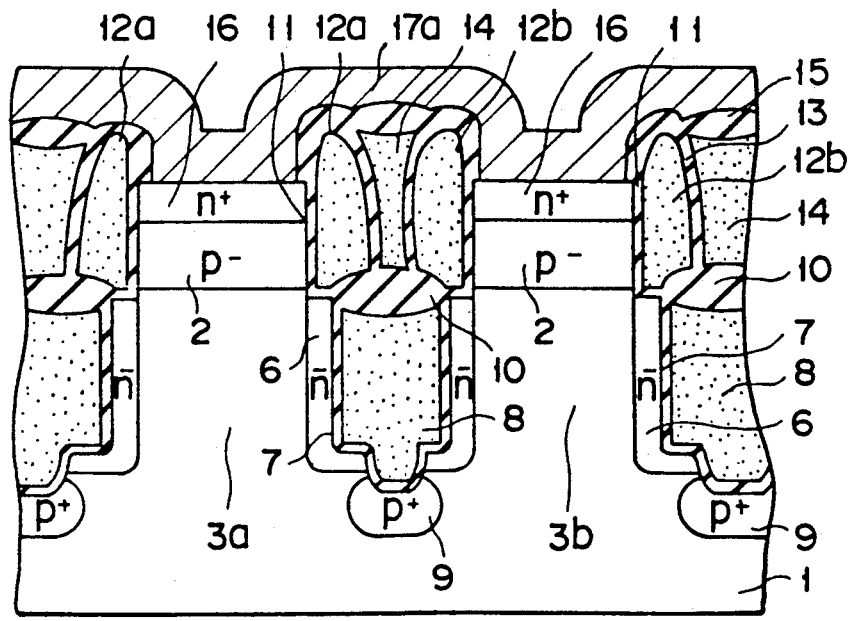

Thereafter, as shown in FIG. 3D, the film 24 is removed by an ammonium fluoride solution, and an SiO$_2$ film is deposited on the entire surface to have a thickness of about 100 nm by CVD. The SiO$_2$ film is etched by RIE to form a third mask 25 on only side walls of the projection 3. The substrate is etched by a thickness of about 0.5 μm by RIE using the mask 25 to form third grooves 4c for isolating the layer 6 in units of memory cells. In this state, boron ions are implanted at an acceleration voltage of 100 keV and a dose of $5 \times 10^{12}$ ions/cm$^2$ to form the p$^+$-type layer 9 as a channel stopper for assuring element isolation on a bottom portion of each groove 4c. Alternatively, a step of depositing the SiO$_2$ film 25 may be omitted, and the AsSG film 24 may be used as the third mask.

Thereafter, as shown in FIG. 3E, the film 25 is removed, and thermal oxidation is performed to form the 10-nm thick capacitor insulating film 7 on the side surfaces at the lower portion of the pillar projection 3. As the capacitor insulating film, a stacked film of an SiO$_2$ film and an Si$_3$N$_4$ film may be used, or a metal oxide film such as Ta$_2$O$_5$ or a thermal nitride film, or a combination of these films may be used.

As shown in FIG. 3F, the capacitor electrode 8 consisting of a first polycrystalline silicon film is buried in the groove 4. More specifically, a phosphorus-doped first polycrystalline silicon film is deposited to have a thickness of about 600 nm and etched by the CDE containing CF4 gas so that the surface of the electrode 8 is substantially leveled with the position of the step 5. In this embodiment, a maximum width of the groove 4 is about 0.6 μm. Therefore, if the deposited polycrystalline silicon film has a thickness of about 0.3 μm or more, its surface is substantially flattened. The entire surface of the polycrystalline silicon film is etched by the CDE to bury the capacitor electrode 8 as shown in FIG. 3F. If the surface is not flattened even by depositing the polycrystalline silicon film, the surface is flattened by a fluid film such as a photoresist. In this case, the entire surface is etched so that etching rates for the fluid film and the polycrystalline silicon film are substantially equal to each other, thereby obtaining the structure shown in FIG. 3F. In this manner, a MOS capacitor utilizing the side surfaces at the lower portion of each pillar projection 3 not covered with the first and second masks 21 and 23 is formed.

Then, as shown in FIG. 3G, the Si$_3$N$_4$ film 23 and the underlying SiO$_2$ film 22 which cover the side surfaces at the upper portion of the projection 3 on which a MOSFET is to be formed are removed. Thereafter, thermal oxidation is performed in an O$_2$+HCl atmosphere at a temperature of 900° C. for about 60 minutes, thereby forming the gate insulating film 11 on the side surfaces at the upper portion of the projection 3. At the same time, the SiO$_2$ film 10 having a film thickness two times that of the gate insulating film 11 is formed on the capacitor electrode 8. A phosphorus-doped second polycrystalline silicon film is then deposited to have a thickness of about 25 nm and etched by RIE, thereby forming the gate electrodes 12a and 12b on the side surfaces at the upper portions of the projections 3. Each gate electrodes 12a and 12b remain all around the projection 3 in a self-alignment manner without using a mask. The gate electrodes 12a and 12b must be continuously formed in one direction of the matrix to form word lines. For this purpose, a photoresist mask is formed on a region of grooves along the word line direction. In this manner, a MOSFET utilizing the side surfaces at the upper portion of the projection 3 is formed.

Thereafter, as shown in FIG. 3H, the surfaces of the gate electrodes 12a and 12b are covered with the SiO$_2$ film 13 formed by thermal oxidation, and the third polycrystalline silicon film 14 is buried in recess portions to flatten the overall substrate. The film 13 may be formed not by thermal oxidation but by CVD. In order to flatten the film 14, a polycrystalline silicon film is deposited on the entire surface, the surface is flattened by a photoresist, and the entire surfaces of the film and the photoresist are etched by dry etching performed at equal etching rate. Thereafter, thermal oxidation is performed in a vapor atmosphere at 850° C. for about 10 minutes to form a SiO film 26 on the surfaces of the gate electrodes 12a and 12b and the buried polycrystalline silicon film 14. At this time, the upper end face of each pillar projection 3 is covered with the Si$_3$N$_4$ film 21b as an anti-oxidation mask, and almost no SiO$_2$ film is formed.

As shown in FIG. 3I, the film 21b is etched by a gas containing, e.g., CF$_4$ gas, and As ions are implanted at a dose of $5 \times 10^{12}$ ions/cm$^2$ and an acceleration voltage of 40 keV, thereby forming the n-type layer 16 serving as a source or drain of the MOSFET in the upper end face of the projection 3. At this time, if necessary, phosphorus ions may be implanted in the upper end face of the projection 3 at a dose of $3 \times 10^{13}$ ions/cm$^2$ and an acceleration voltage of 100 keV to form an n$^-$-type layer below the n-type layer 16, so that the MOSFET obtains an LDD structure. Thereafter, thermal oxidation is performed in a steam atmosphere at a temperature of 850° C. to form the SiO$_2$ film 15 on the substrate surface. The thickness of the film 15 is about 40 nm on the surfaces of the gate electrode consisting of a polycrystalline silicone and the buried polycrystalline silicon film 14 and is about 10 nm on the upper end face of the projection 3. The SiO$_2$ film is etched by an ammonium fluoride solution to selectively expose only the upper end face of each pillar projection 3. A W film is deposited and patterned to form the bit lines 17 connected to the n-type layer 16 and crossing the word lines. In this embodiment, no PEP step is required for a bit line contact, and only the upper end face of the pillar projection 3 can be exposed in a self-alignment manner.

The DRAM according to this embodiment has the following features. That is, the bit line is connected to the source or drain of the MOSFET in a self-alignment manner without a contact hole formation step including photolithography. Therefore, since an alignment margin required in the photolithography need not be formed, the size of the upper end face of each pillar projection is not limited by the alignment margin unlike in the conventional device. As a result, since the pillar projection can be minimized to a limited size, a memory cell can be micropatterned, and a high packing density and a large capacity of the DRAM can be realized. In addition, since an area of the substrate concerning a soft error is reduced, a soft error in a bit line mode can be reduced. Also, a soft error in a cell mode can be reduced by micropatterning of the memory cell.

Since the MOS capacitor is formed by utilizing all the side surfaces at the lower portion of the pillar projection' a relatively large storage capacity can be obtained. Similarly, since the MOSFET is formed by utilizing all the side surfaces at the upper portion of the pillar projection, a channel width can be increased. Therefore, a channel length or the thickness of the gate insulating film need not be decreased in order to obtain a high channel conductance. As a result, good characteristics can be obtained such that a threshold value variation based on hot electrons is small.

In addition, the step is formed in the middle of the pillar projection, and the n$^-$-type layer 6 serving as a memory node is formed by diffusion to have the depth equal to or larger than the height of the step. That is, the junction surface of the layer 6 is formed inside the side surfaces at the upper portion of the pillar projection. For this reason, the characteristics of the MOSFET formed on the side surfaces at the upper portion of the pillar projection can be improved. That is, the layer 6 as a memory node also serves as a source or drain of the MOSFET. Therefore, if the layer 6 is formed lower than the step, a channel region of the MOSFET is curved at the step portion. That is, the channel length is not determined by a straight length of the side surface of the pillar projection. In addition, a defect is generally apt to occur at a corner. Therefore, if such a defect enters into the channel region, the characteristics of the MOSFET become unstable. As in this embodiment, however, if the n$^-$-type layer is diffused to have a depth corresponding to at least the height of the step, the above problem can be solved.

In the method of this embodiment, the first groove is formed in the substrate by using the first mask, and the second groove is formed in the bottom portion of the first groove by forming the second mask on the side surfaces of the first groove. By utilizing the first and second masks, the n$^-$-type layer serving as a memory node is selectively formed on the side surfaces at the lower portion of the pillar projection below the MOSFET formation region. In addition, since the first mask used in groove formation remains immediately before the final step, a bit line contact can be self-aligned, thereby realizing micropatterning of the memory cell.

Figure 4:
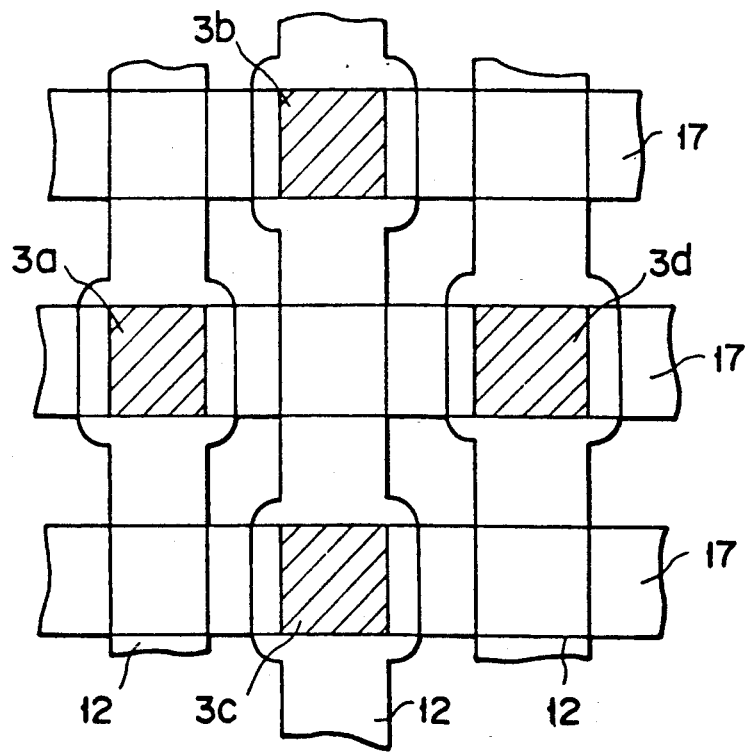
FIG. 4 is a plan view showing a DRAM of a folded bit line type to which the present invention is applied.

In the above embodiment, an open bit line type DRAM has been described. The present invention, however, can be similarly applied to a folded bit line type DRAM. The folded bit line type DRAM is shown in a plan view of FIG. 4 corresponding to FIG. 1.

Figure 5C:
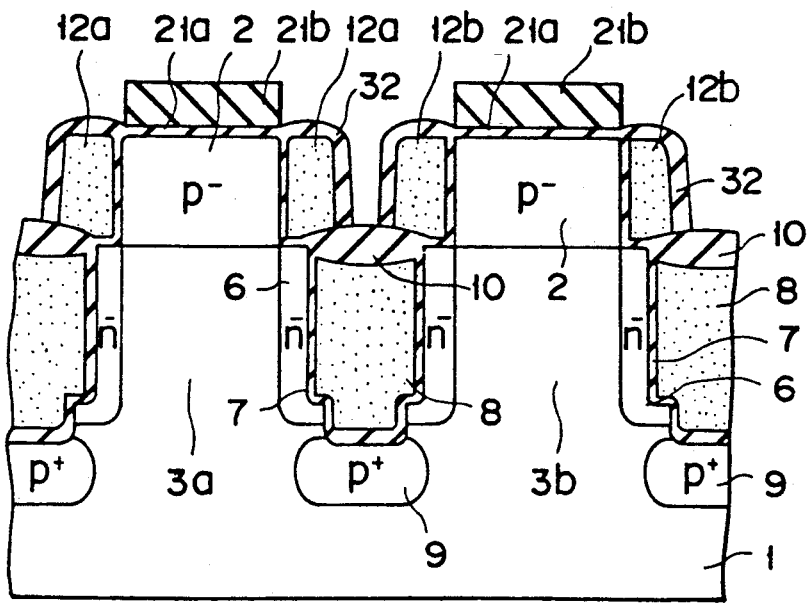

FIGS. 5A to 5E are sectional views showing manufacturing steps in which steps of pattern formation of a gate electrode and flattening of a substrate in the above embodiment are modified. Also in this modification, a capacitor electrode 8 is buried, and a nitride film 23 as a second mask is removed to form a gate insulating film 11, as shown in FIG. 3F of the above embodiment. Thereafter, as shown in FIG. 5A, a phosphorus-doped polycrystalline silicon film 12 for forming a gate electrode is deposited to have a thickness of about 200 nm, and a fluid film 31 such as a photoresist is coated on the entire surface to flatten the surface.

As shown in FIG. 5B, the entire surface is etched by dry etching in which the fluid film 31 and the polycrystalline silicon film 12 are etched at equal etching rates, e.g., CDE using a gas containing CF$_4$ gas, thereby exposing the surface of an Si$_3$N$_4$ film 21$b$.

As shown in FIG. 5C, photolithography and anisotropic dry etching are performed so that the film 12 remains on side surfaces of a pillar projection 3 and a wiring region as a word line, thereby forming gate electrodes also serving as word lines. Thermal oxidation is performed in a steam atmosphere at a temperature of 850° C. to form a 100-nm thick SiO$_2$ film 32 on the surface of each gate electrode 12.

Figure 5D:
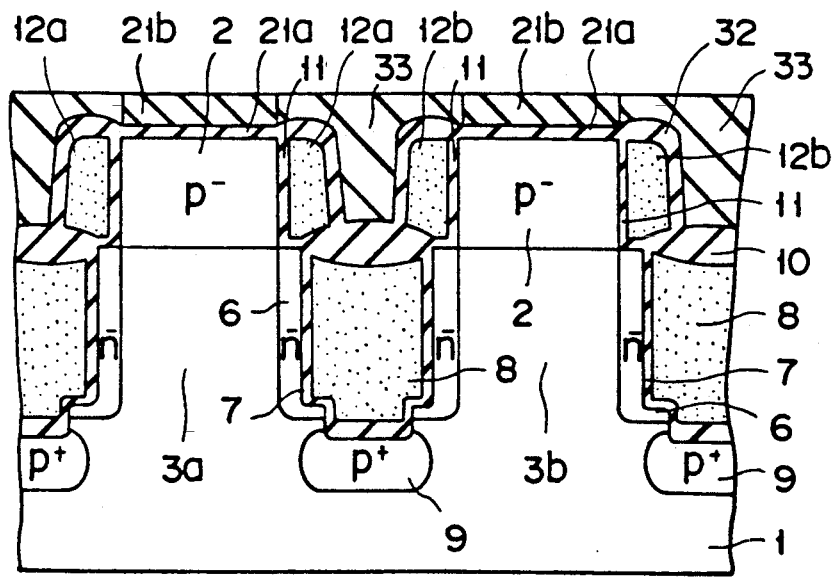

As shown in FIG. 5D, a viscous CVD SiO$_2$ film, e.g., a borophosphorus glass film (BPSG film) 33 is deposited on the entire surface and caused to flow at a temperature of about 900° C. to flatten the surface of a semiconductor structure. Thereafter, the entire surface is dry-etched to expose the Si$_3$N$_4$ film 21$b$.

Figure 5E:
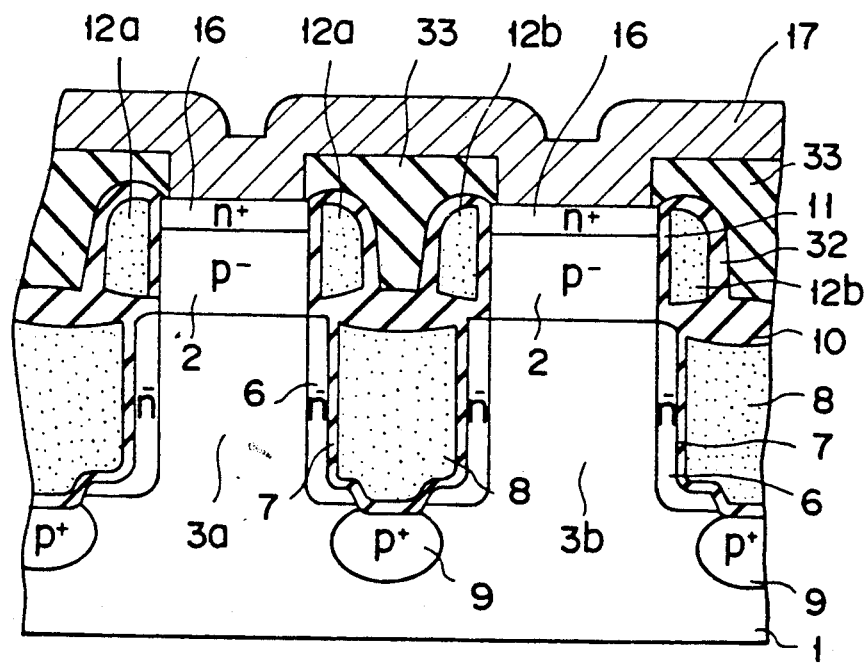

As shown in FIG. 5E, the exposed film 21$b$ is selectively etched, and an n$^+$-type layer 16 is formed in the upper end face of each pillar projection 3 by ion implantation. An SiO$_2$ film 21$a$ on the surface of the layer 16 is removed by an ammonium fluoride solution without a mask, and a W film is deposited and patterned to form bit lines 17.

The same effects as in the above embodiment can be obtained by this modification. In this modification, the SiO$_2$ film 33 thicker than that in the above embodiment remains below the bit lines. Therefore, a capacity formed between the bit lines and the substrate or the word lines can be reduced to achieve a high-speed operation and a high performance of the DRAM.

Figure 6A:
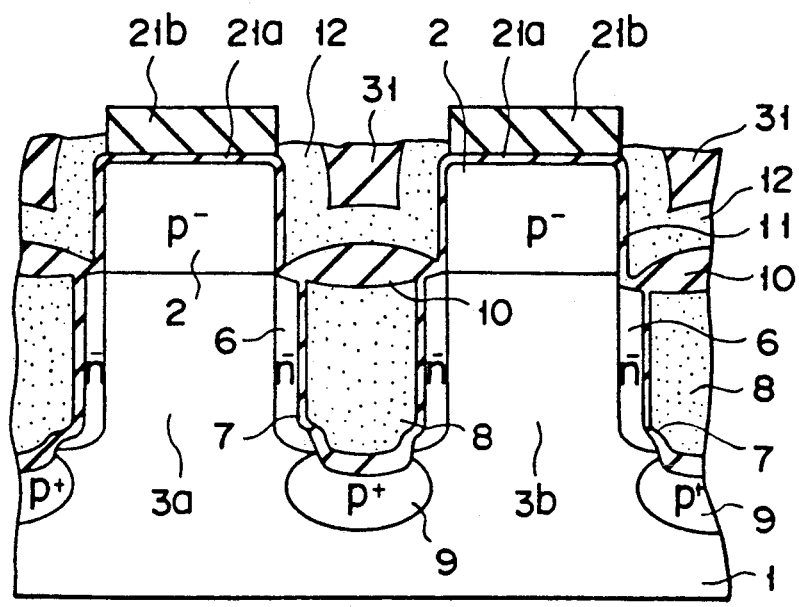
FIGS. 6A and 6B are sectional views showing a method of manufacturing a DRAM having a height of a gate electrode different from that of a gate electrode of the first embodiment.
Figure 6B:
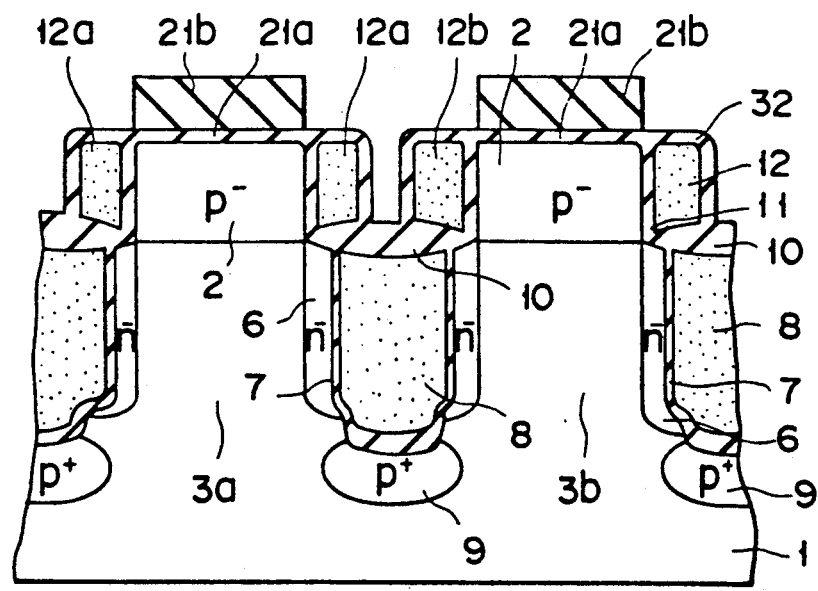

FIGS. 6A and 6B show another modification in which steps corresponding to FIGS. 5B and 5C in the above modification are modified. As in the above modification, a semiconductor structure is flattened by a polycrystalline silicon film 12 for a gate electrode and a fluid film 31. Thereafter, as shown in FIG. 6A, etching is performed such that the flattened surface is positioned above the upper end face of each pillar projection 3 by an amount corresponding to the film thickness of the gate electrode. Since the step shown in FIG. 6A is performed, when the gate electrode 12 is patterned, its upper edge is positioned below the upper end face of the projection 3, in a step shown in FIG. 6B. As a result, a parasitic capacitance of a gate electrode also serving as a word line can be reduced, and a capacity of a bit line can be reduced.

A step is formed between the MOSFET formation region and the capacitor formation region formed on the side surfaces of the pillar projection in the above embodiment, but this step can be omitted. FIGS. 7A and 7B show main steps of such a modification. As shown in FIG. 7A, an $Si_3N_4$ film 23 is formed on side surfaces of each pillar projection 3 obtained by forming a first groove, and a second groove 4b is formed by etching, as in the above embodiment. Thereafter, as shown in FIG. 7B, the Si surface exposed in the second groove 4b is etched by dry etching containing $CF_4$ gas to reduce a step. A MOS capacitor and a MOSFET are formed and a bit line is connected to the upper end face of the pillar projection in a self-alignment manner in the same manner as in the above embodiment.

In this modification, even if an $n^-$-type layer serving as a memory node is diffused shallow, a corner does not extend into a channel region of the MOSFET because of the presence of the step. As a result, characteristics of the MOSFET can be improved.

Figure 8C:
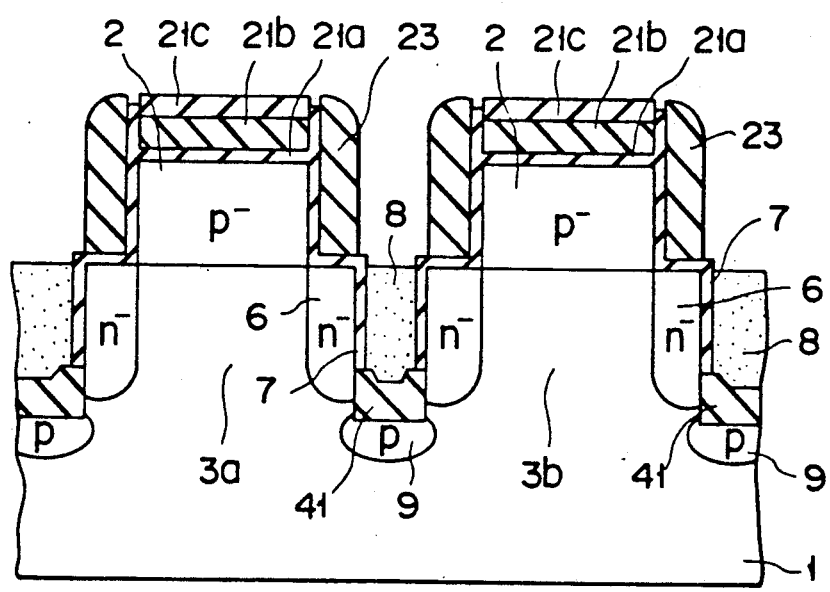

FIGS. 8A to 8C show main steps of a modification in which element isolation is performed more reliably. After second grooves 4b are formed via the step shown in FIG. 3B, boron ions, for example, are implanted at a dose of $3 \times 10^{12}$ ions/cm$^2$ and 100 keV in bottom portions of the grooves 4b, thereby forming a $p^+$-type layer 9 serving as a channel stopper, as shown in FIG. 8A. At this time, ion implantation is performed vertically to a substrate. Thereafter, a CVD $SiO_2$ film 41 is deposited on the entire surface to have a film thickness of about 100 nm, and a fluid film such as a photoresist 42 is coated thereon to flatten a semiconductor structure. The film 42 is etched in an atmosphere containing $O_2$ gas so as to remain the film 42 only on a bottom portion of a groove by a thickness of about 0.5 μm.

As shown in FIG. 8B, the $SiO_2$ film 41 is selectively etched by using the photoresist 42 as a mask and an ammonium fluoride solution so as to remain only on a bottom portion of a groove 4. Thereafter, an arsenosilicate film (AsSG film) 43 containing arsenic as an impurity is deposited to have a thickness of about 70 nm. Annealing is performed in a nitrogen atmosphere at 1,000° C. to diffuse As from the AsSG film 43, thereby forming an $n^-$-type layer 6. At this time, since the thick $SiO_2$ film 41 remains on the bottom portion of the groove, the n-type impurity is not diffused.

As shown in FIG. 8C, the film 43 is removed, a capacitor insulating film 7 is formed, and a capacitor electrode 8 consisting of a first polycrystalline silicon film is buried in the groove. Thereafter, a DRAM can be formed in accordance with the steps from FIG. 3G.

According to this modification, adjacent memory cells can be reliably isolated by the thick $SiO_2$ film 41 and the p-type layer 9. In addition, since the thick film 41 is formed, an impurity concentration of the layer 9 can be decreased. As a result, junction leakage between the $n^-$-type layer 6 of the MOS capacitor and the p-type layer 9 can be reduced.

FIGS. 9A and 9B show still another modification capable of obtaining the same effects as in the modification shown in FIGS. 8A to 8C. After the $SiO_2$ film 25 used as the third mask is removed in the step shown in FIG. 3D of the above embodiment, a 70-nm thick CVD $SiO_2$ film 51 is deposited on the entire surface, and a photoresist 52 is coated thereon to flatten a semiconductor structure. As shown in FIG. 9A, the photoresist 52 is etched by RIE in a gas atmosphere containing $O_2$ gas so as to remain the photoresist 52 on a bottom portion of a groove by a thickness of about 0.5 μm. As shown in FIG. 9B, the $SiO_2$ film 51 is selectively etched by, e.g., an ammonium fluoride solution by using the remaining photoresist 52 as a mask so as to remain only on the bottom portion of the groove. Thereafter, the photoresist 52 is removed, a capacitor insulating film is formed, and a DRAM is manufactured in accordance with the steps from, e.g., FIG. 3F.

Also in this modification, adjacent memory cells can be reliably isolated. In addition, in this modification, the $SiO_2$ film 51 is caused to remain on the groove bottom portion after an $n^-$-type layer is formed on a MOS capacitor region. Therefore, the film thickness of the film 51 is not much varied in the subsequent steps, thereby achieving element isolation with good uniformity.

A thick $SiO_2$ film for element isolation can be formed on a bottom of a groove by, e.g., selectively forming an $Si_3N_4$ film on side surfaces of the groove and oxidizing the semiconductor structure in a steam atmosphere. In this manner, an $SiO_2$ film having a thickness of about 70 nm can be formed on the groove bottom portion.

In the above modifications, in order to continuously form the gate electrode to be used as a word line, photolithography in which a mask of, e.g., a photoresist is formed between adjacent memory cells along a word line direction is used in the gate electrode patterning step. By considering a memory cell arrangement, however, the gate electrode also serving as a word line can be patterned without the photolithography using a photoresist. Such a modification will be described next.

Figure 10A:
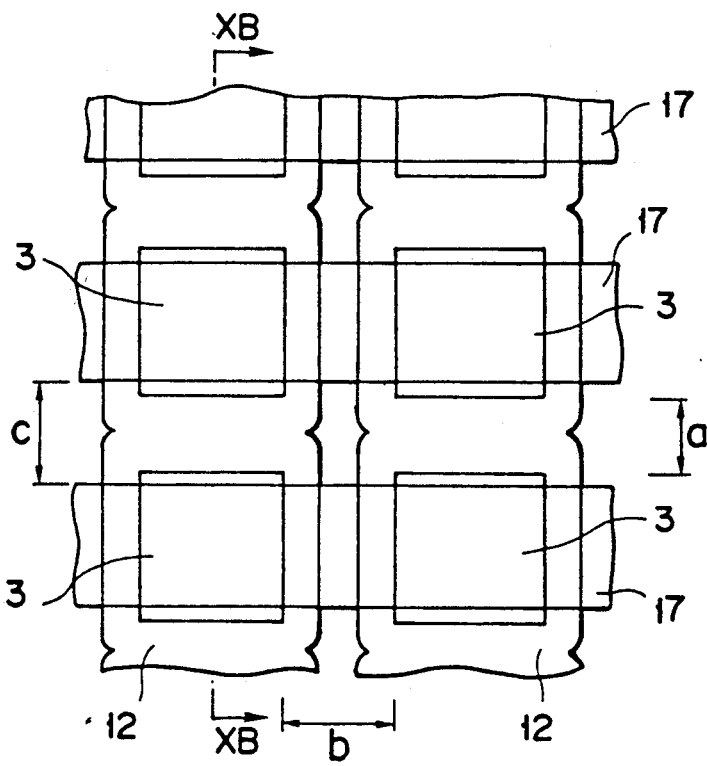
FIG. 10A is a plan view showing a DRAM in which a word line can be patterned without a photolithograpic step.
Figure 10B:
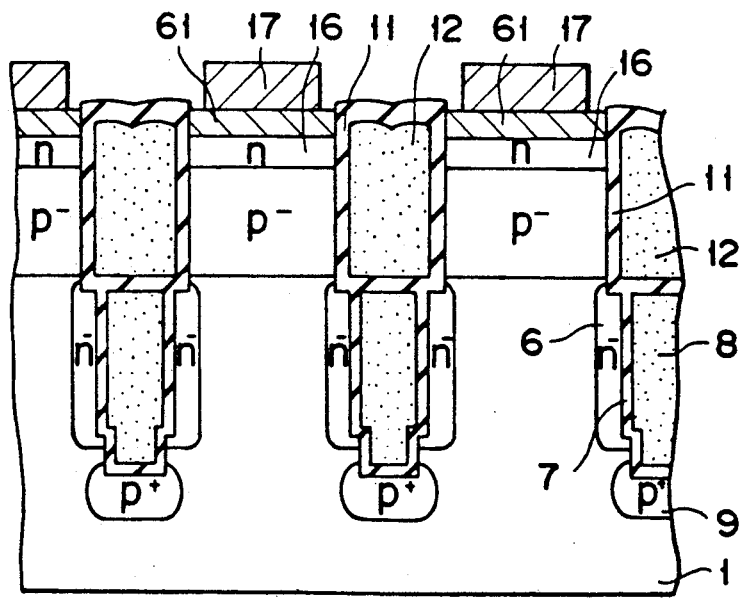
FIG. 10B is a sectional view taken along a line XB—XB in FIG. 10A.

FIGS. 10A and 10B show a DRAM according to such a modification. Referring to FIGS. 10A and 10B, the same reference numerals as in the above embodiment denote the same parts and a detailed description thereof will be omitted. A shown in FIG. 10A, pillar projections 3 for forming memory cells are arranged at an interval a in a word line direction and an interval b in a bit line direction. At this time, a value of the interval is set such that grooves are automatically buried upon deposition of a second polycrystalline silicon film 12 for forming gate electrodes also serving as word lines by, e.g., CVD. More specifically, the value of the interval a is set to be smaller than a value twice the film thickness of the second polycrystalline silicon film 12. For example, if the thickness of the film 12 is about 200 nm, the interval a is set to be 400 nm or less, e.g., 300 nm. A value of the interval b in the bit line direction is set to be larger than a value twice the thickness of the film 12. For example, if the thickness of the film 12 is 300 nm, the interval b is set to be 600 nm. With this pillar projection arrangement, after the second polycrystalline silicon film 12 is deposited, the entire surface of the film 12 is anisotropically etched. As a result, the structure shown in FIG. 10A and 10B in which the gate electrodes 12 are continuously formed in the word line direction and isolated in the bit line direction can be obtained.

In this modification, as shown in FIG. 10A, the interval a between bit line contacts may be smaller than an interval c between bit lines. Therefore, in this modification, after the upper end face of the pillar projection 3 is exposed, a W film 61 is selectively grown on the Si exposed surface to have a thickness of about 100 nm by using, e.g., $WF_6$ gas. Thereafter, a 400-nm thick Al-Si-Cu film is deposited on the W film 61 and patterned by conventional photolithography using RIE to form bit lines 17.

According to this modification, photolithography using a photoresist is not used in patterning of the gate electrode also serving as a word line. Therefore, a step can be simplified, and a packing density can be increased because a memory cell interval is reduced. In addition, the W film 61 is selectively grown under the bit lines to serve as a stopper when the bit lines consisting of the Al-Si-Cu film are etched. Therefore, a problem in which the substrate is erroneously etched and short-circuited with the bit lines can be prevented.

Figure 11A:
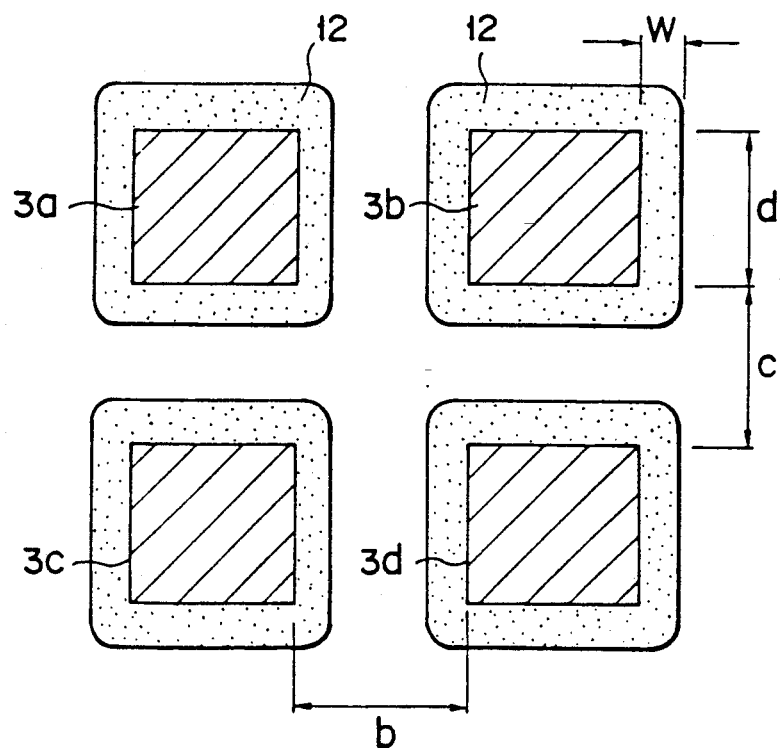
FIGS. 11A and 11B are plan views for explaining a manufacturing method for connecting a word line without a photolithograpic step.
Figure 11B:
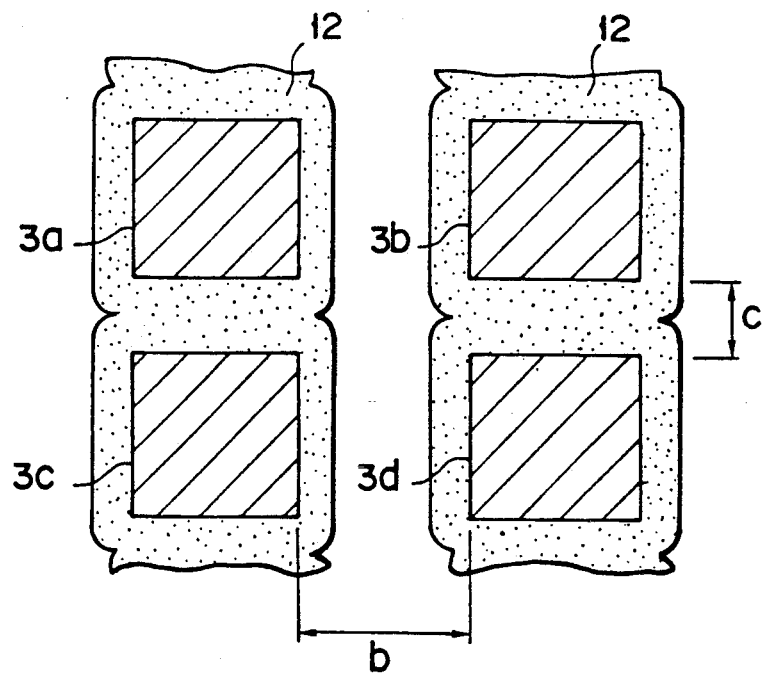

FIGS. 11A and 11B are views for explaining in detail how continuous word lines are formed in this modification. FIGS. 11A and 11B are plan views showing a memory cell region of four bits. Referring to FIGS. 11A and 11B, an interval d corresponds to a width of a pillar projection 3 in a word line direction, and intervals b and c correspond to intervals between the pillar projections in bit and word line directions, respectively. Reference symbol W denotes a thickness of a second polycrystalline silicon film 12. If a value of the interval c is larger than a value twice the film thickness W, the polycrystalline silicon film is etched without using a resist step and remains on only side surfaces of each pillar projection 3. As a result, as shown in FIG. 11A, gate electrodes are isolated from each other. If the value of the interval is set to be smaller than a value twice that of the W and the value of the interval b is set to be larger than a value twice that of the W, the gate electrodes are connected in only the word line direction, as shown in FIG. 11B.

Figure 12A:
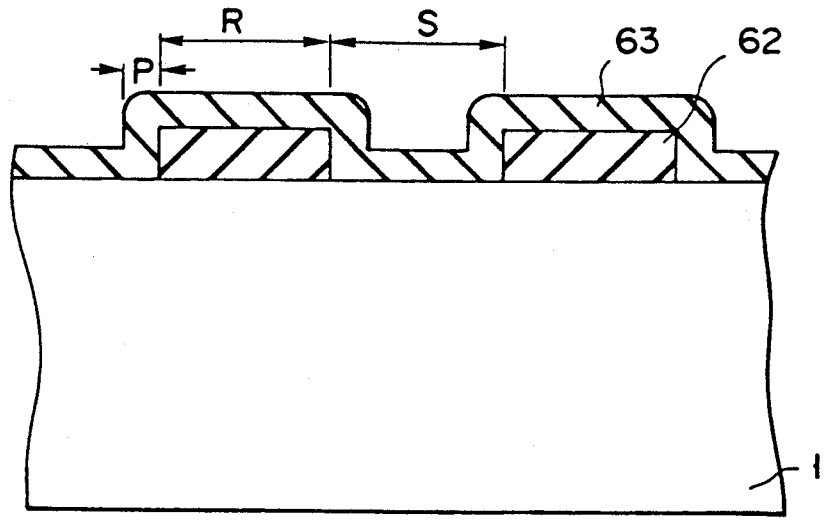
FIGS. 12A and 12B are sectional views showing still another modification of a DRAM manufacturing method for connecting a word line without a photolithographic step.
Figure 12B:
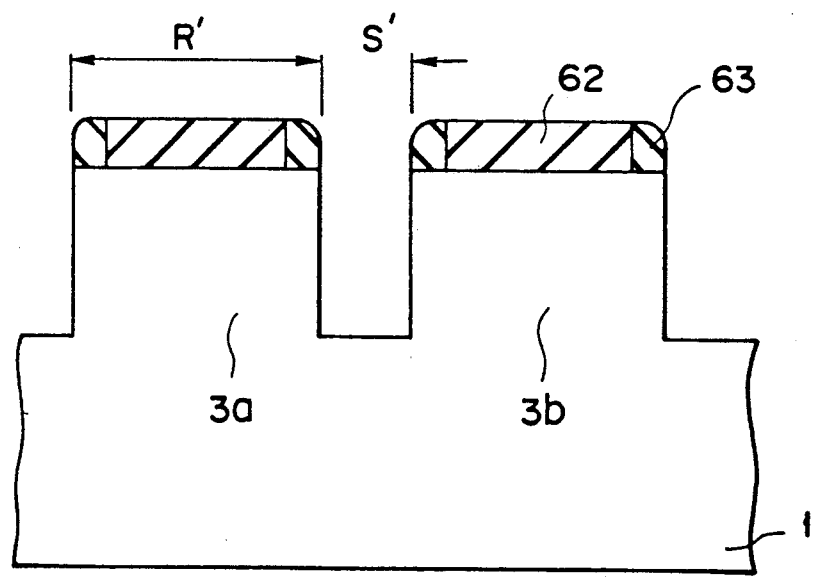

FIGS. 12A and 12B show a method of setting intervals for connecting gate electrodes in a word line direction as described above. As shown in FIG. 12A, mask members 62 for etching a substrate are formed to have a predetermined shape. Referring to FIG. 12A, reference symbol R denotes the width of each mask member 62, and reference symbol S denotes an interval between the adjacent mask members 62. A mask member 63 as a second layer consisting of the same material as that of the mask member 62 is deposited on the entire surface. At this time, a thickness P of the second mask member 63 is determined in accordance with a final interval between pillar projections in the word line direction. For example, assuming that $R=0.5$ $\mu$m, $S=0.5$ $\mu$m, and final interval $S=0.3$ $\mu$m, the film thickness P is set to be about 0.1 $\mu$m. In this state, the entire surface is anisotropically etched so that the second mask member 63 remains on side walls of the first mask members 62. When the substrate is etched by RIE using the mask members 62 and 63, grooves are formed such that the interval S' between the pillar projections 3 is 0.3 $\mu$m.

With this method, the interval between the projections 3 can be set to be smaller than a minimum patterning size. In this manner, a higher packing density of the DRAM can be realized.

Figure 13A:
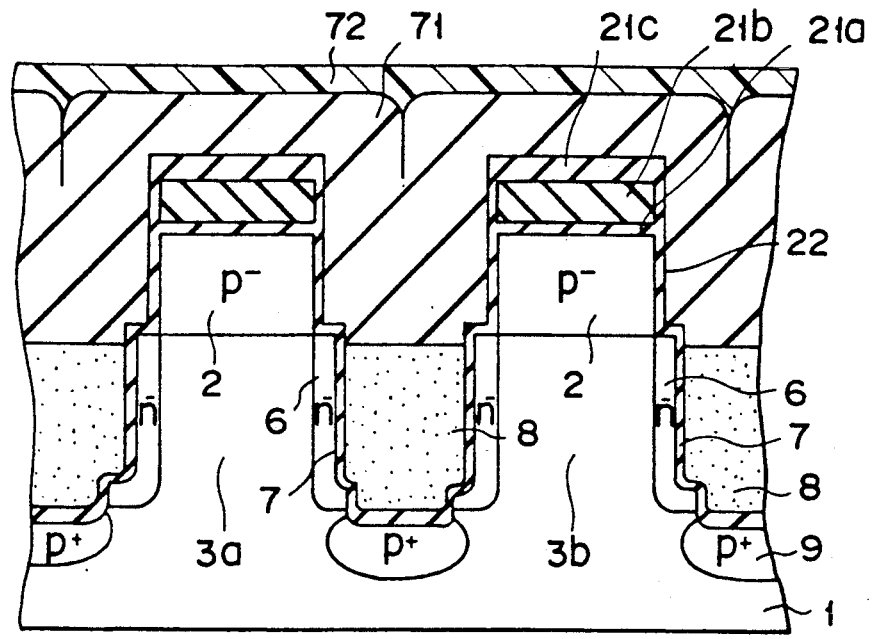

FIGS. 13A to 13F show manufacturing steps according to still another modification in which a capacitor electrode is isolated from a gate electrode by another isolating method. After the step shown in FIG. 3F of the above embodiment, an $SiO_2$ film 71 is deposited on the entire surface to have a thickness of, e.g., 700 nm by CVD, and a photoresist 72 is applied thereto to flatten a semiconductor structure, as shown in FIG. 13A.

Figure 13B:
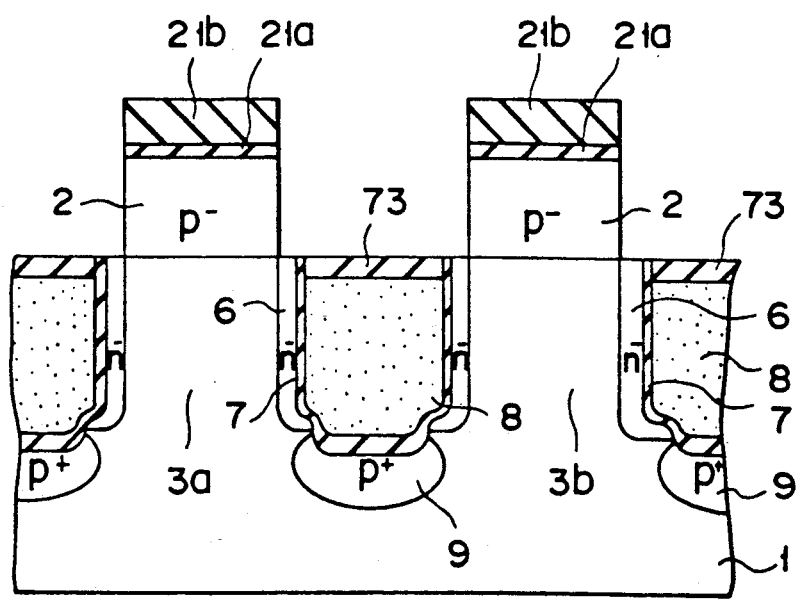

As shown in FIG. 13B, all the surfaces of the photoresist 72 and the $SiO_2$ film 71 are etched at equal etching rates by RIE so that a 100-nm thick $SiO_2$ film 73 remains on each capacitor electrode 8 already buried. At this time, etching selectivity of $SiO_2$ to $Si_3N_4$ films 21b is preferably 10 times or more.

As shown in FIG. 13C, a 15-nm thick gate insulating film 11 is formed on each MOSFET region by thermal oxidation, a phosphorus-doped second polycrystalline silicon film is deposited to have a thickness of 200 nm. The second polycrystalline silicon film is patterned by anisotropic etching to form gate electrodes 12.

As shown in FIG. 13D, an insulating film 13 is formed on the surfaces of the gate electrodes as in the embodiment shown in FIGS. 3A to 3I. A polycrystalline silicon film 14 is buried in recess portions to flatten a semiconductor structure.

Figure 13E:
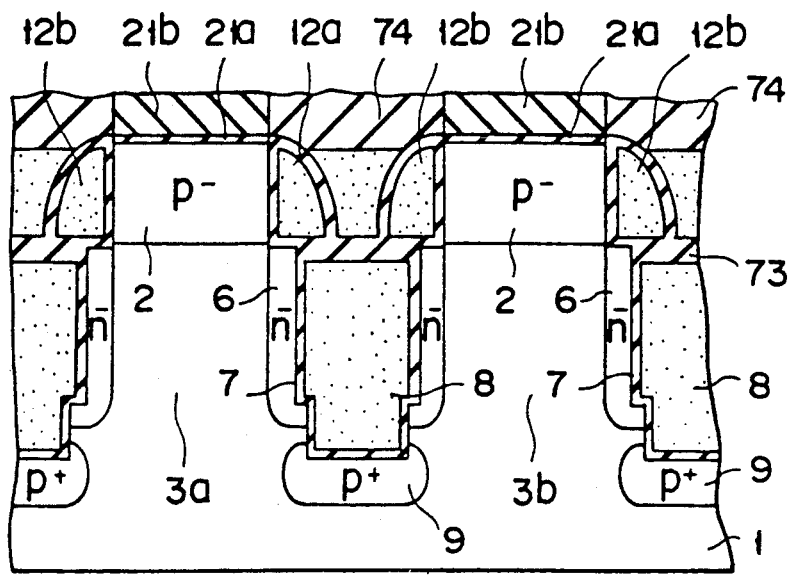

As shown in FIG. 13E, a PSG film 74 is deposited on the entire surface to have a thickness of about 400 nm and annealed at a temperature of about 1,000° C. to be flattened. Thereafter, the entire surface of the semiconductor structure is etched to expose the $Si_3N_4$ film 21b.

Figure 13F:
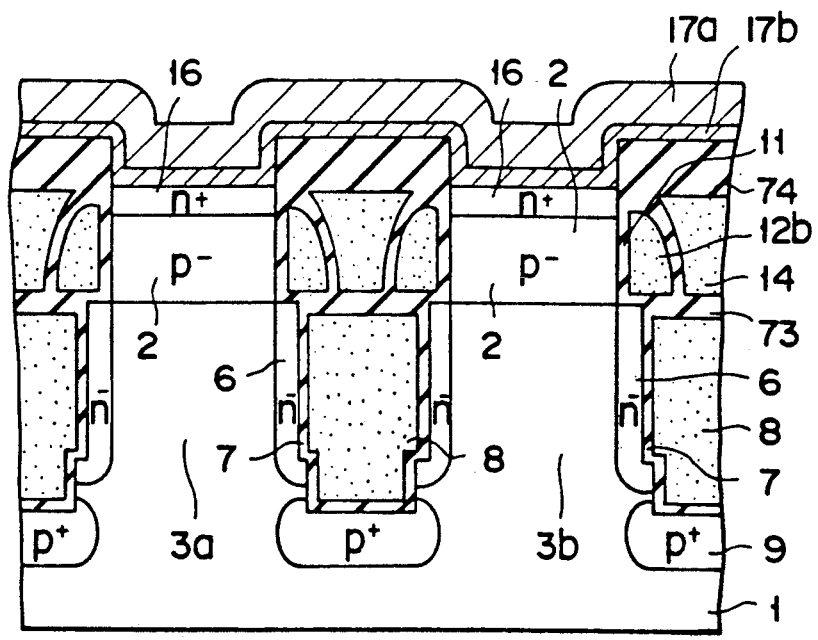

As shown in FIG. 13F, the exposed film 21b is selectively removed, and ions are implanted in the upper end faces of the pillar projections, thereby forming n+-type layers 16 serving as source or drain diffusion layers. Subsequently, a two-layered film of an arsenic-doped polycrystalline silicon film 17a and a molybdenum silicide ($MoSi_2$) film 17b is formed and patterned on the entire surface, thereby forming bit lines.

According to this modification, the capacitor electrode 8 and the gate electrode 12 of the MOSFET which are vertically stacked can be isolated from each other without a thermal oxide film In this method, since a crystal defect caused by a stress produced in groove formation and thermal steps can be suppressed, a data storage property of a memory cell can be improved.

In the above modifications, in order to adjust a threshold value of the MOSFET, ions are implanted in the entire surface of the substrate to reach the MOSFET formation region before groove formation, thereby forming the p--type layers The p--type layer, however, need only be formed in a side surface portion of each pillar projection serving as the MOSFET region. Therefore, for example, after the pillar projections are formed and the capacitors are buried, ion implantation may be performed to adjust an impurity concentration of a channel region. In this case, ion implantation is performed to the substantially vertical side surfaces. Therefore, by performing oblique ion implantation including rotation of the wafer, the impurity is uniformly doped in the side surfaces. In this case, the wafer may be continuously rotated or intermittently rotated every 90°.

Examples of the bit line material are, in addition to the W film or the Al-Si-Cu film described in the above embodiment, another refractory metal such as molybdenum, a refractory metal silicide, or a combination of these metals and a polycrystalline silicon film.

In the above embodiment, the p-type Si substrate is used. The entire memory cell region, however, may be formed in a p-type well by, e.g., boron diffusion. At this time, if an impurity concentration of the groove bottom portion serving as an element isolation region is about $1 \times 10^{17}$ atoms/cm$^3$, a p-type impurity diffusion step for element isolation can be omitted.

A second embodiment of the present invention will be described in detail below with reference to FIGS. 14A and 14B.

Figure 14A:
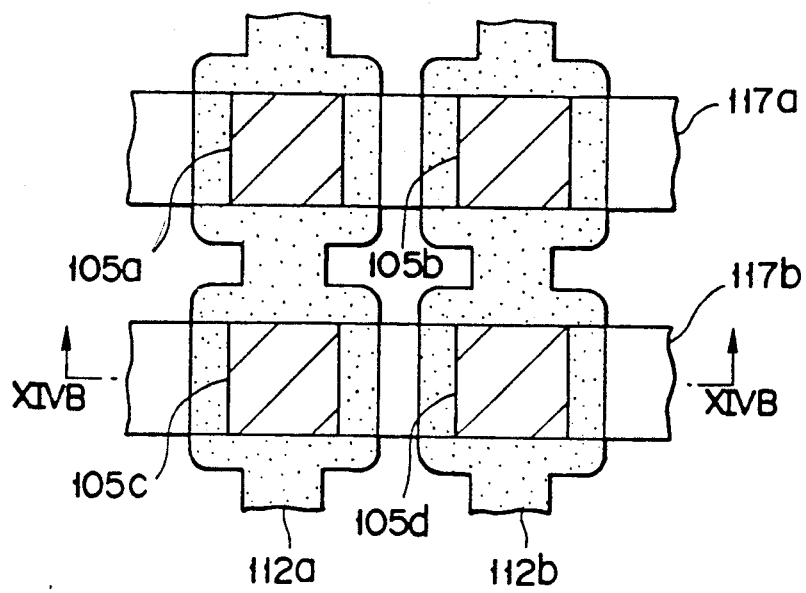
FIG. 14A is a plan view showing a DRAM according to a second embodiment of the present invention.
Figure 14B:
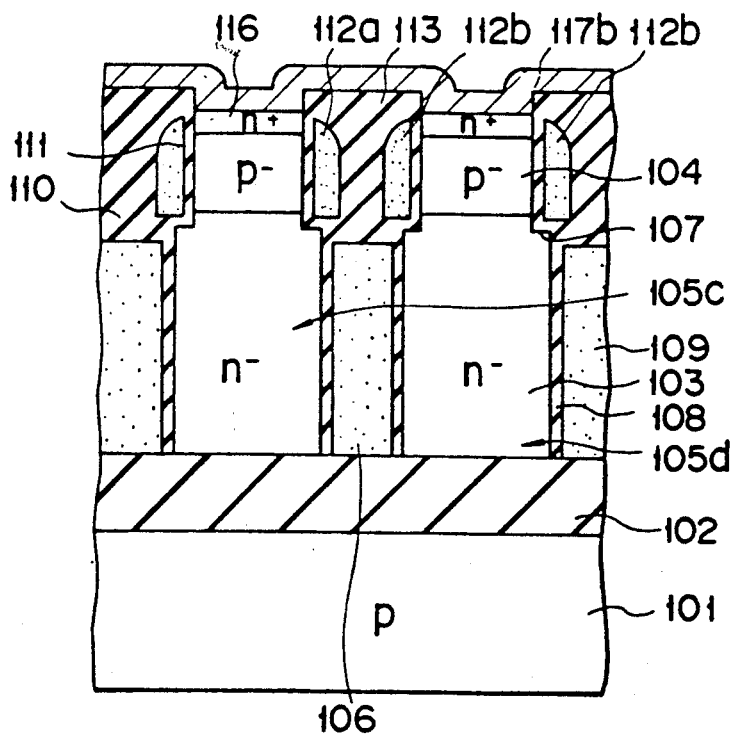
FIG. 14B is a sectional view taken along a line XIVB—XIVB in FIG. 14A.

FIG. 14A shows a four-bit DRAM portion.

Referring to FIG 14A, a silicon oxide film 102 is formed on the surface of a p-type silicon substrate 101, and an n$^-$-type layer 103 serving as a memory node of a MOS capacitor and a p$^-$-type layer 104 serving as a channel region of a MOSFET are stacked thereon. A plurality of small pillar projections 105a, 105b, 105c and 105d isolated by grooves 106 formed in longitudinal and transverse directions in the substrate are arranged in a matrix manner.

A step 107 is formed on side surfaces of each pillar projection 105. A portion below a position slightly above the step 107 is the n$^-$-type layer 103. A capacitor insulating film 108 is formed on all the side surfaces at a lower portion of the projection 105. A capacitor electrode 109 is buried in each groove 106. A MOS capacitor is constituted by the n$^-$-type layer 103, the capacitor insulating film 108 and the capacitor electrode 109. A boundary between the n$^-$-type layer 103 and the channel layer 104 is set to be a position equal to or slightly higher than that of the step 107. The capacitor electrode 109 is continuously formed as a plate electrode common for all memory cells. The electrode 109 is extracted at a peripheral portion of the DRAM.

The silicon oxide layer 102 is formed below bottom portions of the groove 106 and the projections 105. The layer 102 serves as an insulating layer for element isolation and for preventing a soft error caused by α-rays.

Gate electrodes 112a and 112b are formed on side surfaces at an upper portion of each pillar projection 105 with a gate insulating film 111 interposed therebetween. The gate electrode 112 and the capacitor electrode 109 are vertically buried in the groove 106 and isolated from each other by an insulating film 110. The gate electrodes 112 surround the projection 105 and are continuously formed in one direction of the matrix to serve as word lines. An insulating film 113 is buried in a recess portion of the groove 106 except for the buried gate electrode 112 to flatten a semiconductor structure.

The surface of the substrate in which the capacitor and gate electrodes 109 and 112 are buried is covered with the insulating film 113, and bit lines 117a and 117b consisting of, e.g., a polycide film of a polycrystalline silicon film doped with As and a tungsten silicide film are formed thereon. An n+-type layer 116 serving as a source or drain of the MOSFET is diffused in the upper end face of each pillar projection 105. The bit line 117 is directly connected to the layer 116 in a self-alignment manner without performing a PEP step for forming a contact hole.

A method of manufacturing this DRAM will be described below.

Figure 15A:
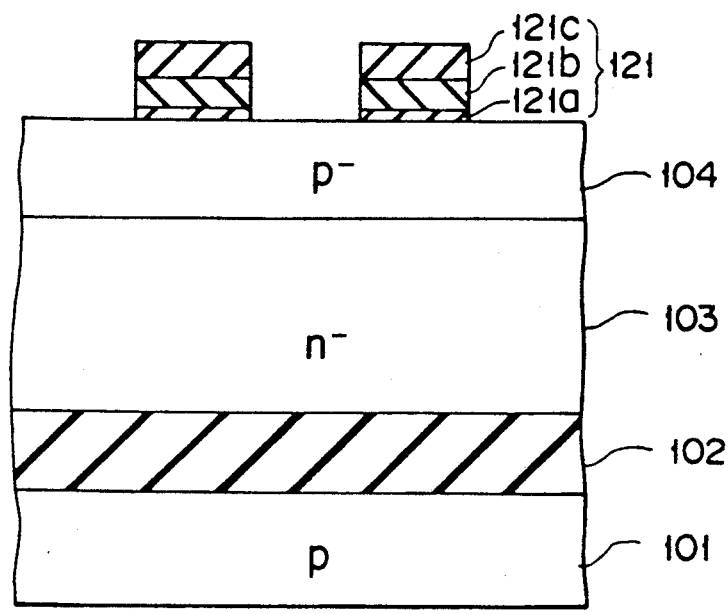
FIGS. 15A to 15H are sectional views showing a method of manufacturing the DRAM shown in FIGS. 14A and 14B.

As shown in FIG. 15A, the SiO$_2$ film 102 having a film thickness of about 8,000 Å is formed as an insulating film on the p-type silicon substrate 101, and the 103 serving as a memory node is 3-μm thick n$^-$-type layer 103 serving as a memory node is formed thereon by, e.g., thermal diffusion of antimony (Sb). The p$^-$-type layer 104 serving as a channel region of the MOSFET is formed on the layer 104.

The substrate having the above layers is formed by, e.g., a method as shown in FIGS. 16A to 16E. That is, a wafer bonding method will be described below with reference to FIGS. 16A to 16E.

Figure 16A:
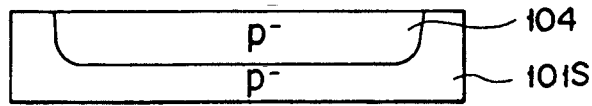
FIGS. 16A to 16E are sectional views showing a wafer bonding method for forming a multilayered substrate used in the manufacturing method shown in FIGS. 15A to 15H.

First, two wafers, i.e., silicon substrates 101 and 101S are prepared. As shown in FIG. 16A, boron (B) ions, for example, are implanted in the p$^-$-type silicon substrate 101S at a dose of $5 \times 10^{12}$ ions cm$^{-2}$ and an acceleration voltage of 100 keV. The substrate 101S is annealed to form the p$^-$-type layer 104 having a higher concentration than that of the substrate 101S. The p$^-$-type layer is for forming a channel region of the MOSFET and is required to have a thickness of 6 μm or more and a uniform concentration region. The layer 104 may be formed by epitaxial growth in place of ion implantation. A thick layer having a uniform concentration can be easily formed by the epitaxial growth.

Figure 16B:
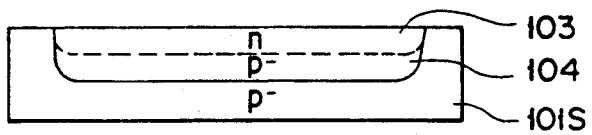

As shown in FIG. 16B, the n-type impurity layer 103 having a concentration of $1 \times 10^{19}$ atoms cm$^{-3}$ is formed on an arbitrary region of the substrate 101S to have a thickness of about 3 μm. The layer 103 can be formed by thermal diffusion of antimony (Sb) or the like or ion implantation of arsenic (As).

Oxide films 102a and 102b each having a thickness of 50 nm to 1 μm, e.g., 400 nm are formed on the surfaces of the substrates 101 and 101S by thermal oxidation in a normal H$_2$+O$_2$ atmosphere.

Figure 16C:
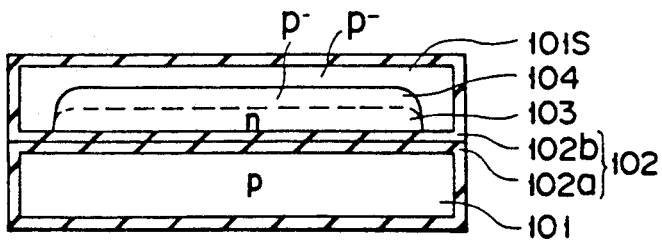

As shown in FIG. 16C, the substrates 101 and 101S having the oxide films 102 thereon are bonded to each other. At this time, the oxide films 102 are bonded to each other so that the n-type impurity layer 103 is located inside. The two substrates 101 and 101S are bonded under a pressure of, e.g., $10^{-1}$ Pa while a pulsed voltage of +100 to +500 V is applied therebetween. At this time, the substrates are heated to a maximum of 800° C. Thereafter, normal annealing may be performed in, e.g., an N$_2$ atmosphere at 1,100° C. for 30 minutes.

Figure 16D:
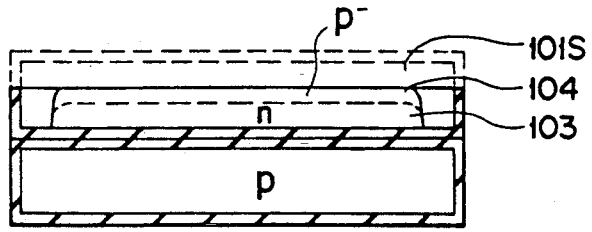

As shown in FIG. 16D, after the two silicon substrate 101 and 101S are bonded, the surface of the substrate 101S is polished to obtain a thin film of the substrate 101S. A polishing step may be performed by a combination of normal physical polishing with chemical polishing performed by etching using a solution mixture of hydrofluoric acid, nitric acid and acetic acid solutions as an etching solution.

Figure 16E:
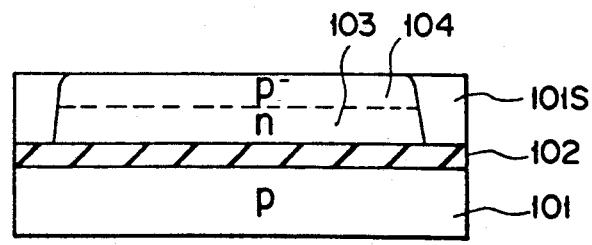

Similar to a normal silicon substrate, the surface of the substrate 101S is mirror-polished. In this manner, a silicon substrate having a multilayered structure in which the oxide film 102, the n-type impurity layer 103 and the p$^-$-type layer 104 are sequentially stacked on the silicon substrate 101 is obtained, as shown in FIG. 16E.

In the wafer bonding method according to this embodiment, the underlying support substrate 101 is not specified but may be either a p$^-$- or n$^-$-type silicon substrate.

As shown in FIG. 15A, a first mask 121 for covering each memory region is formed on the multi-layered substrate formed as described above by normal photolithography. More specifically, the first mask 121 consists of a 10-nm thick SiO$_2$ film 121a formed by thermal oxidation, a 200-nm thick Si$_3$N$_4$ film 121b as an antioxidation film and a 600-nm thick SiO$_2$ film 121c deposited by CVD.

Figure 15B:
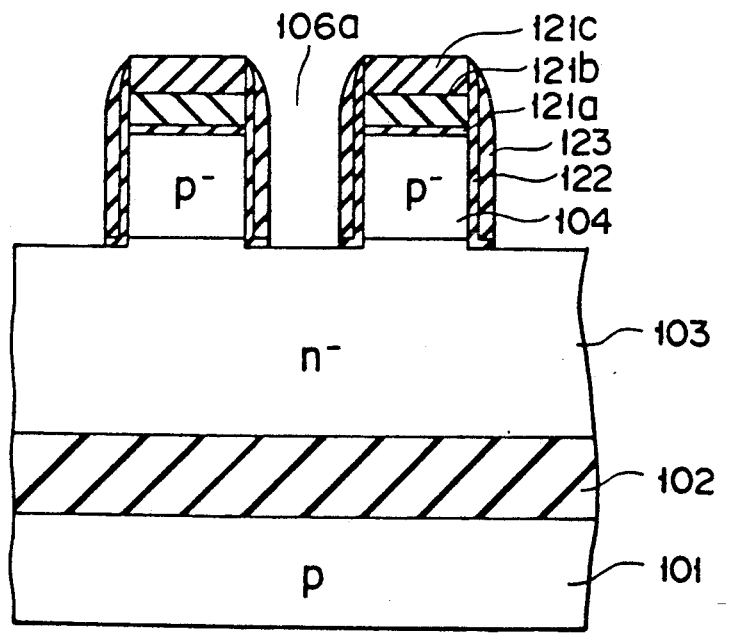

As shown in FIG. 15B, the p$^-$-type layer 104 is etched by reactive ion etching (RIE) using the first mask 121 as an etching mask to form a first groove 106a. The plurality of pillar projections 105 are defined by the groove 106a. Thereafter, an Si$_3$N$_4$ film 123 serving as a second anti-oxidation mask is formed on side surfaces of each pillar projection 105. More specifically, a 20-nm thick SiO$_2$ film 122 is deposited by CVD, and the 200-nm thick Si$_3$N$_4$ film 123 is formed thereon by CVD. The entire surface is anisotropically etched by RIE so that the stacked films remain on the side surfaces of each projection 105 in a self-alignment manner.

Figure 15C:
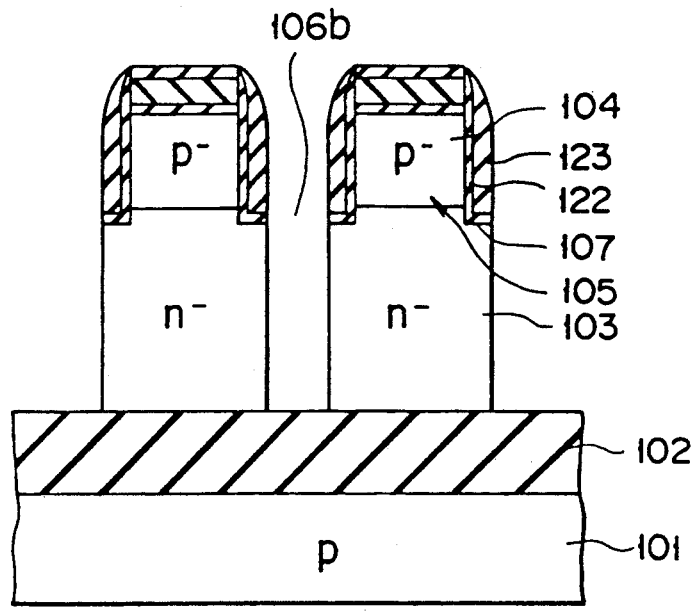

As shown in FIG. 15C, the n-type layer 103 is etched by RIE using chlorine gas using the first and second masks as anti-etching masks. A second groove 106b having a depth of about 3 μm is formed in the first groove 106a so as to reach the insulating layer 102. As a result, the step 107 is formed on the side surfaces of the projection 105. Thereafter, predetermined post-treatment is performed to the etched surface. At this time, a surface impurity concentration of the layer 103 is about $1 \times 10^{19}$ atoms cm$^{-3}$.

Figure 15D:
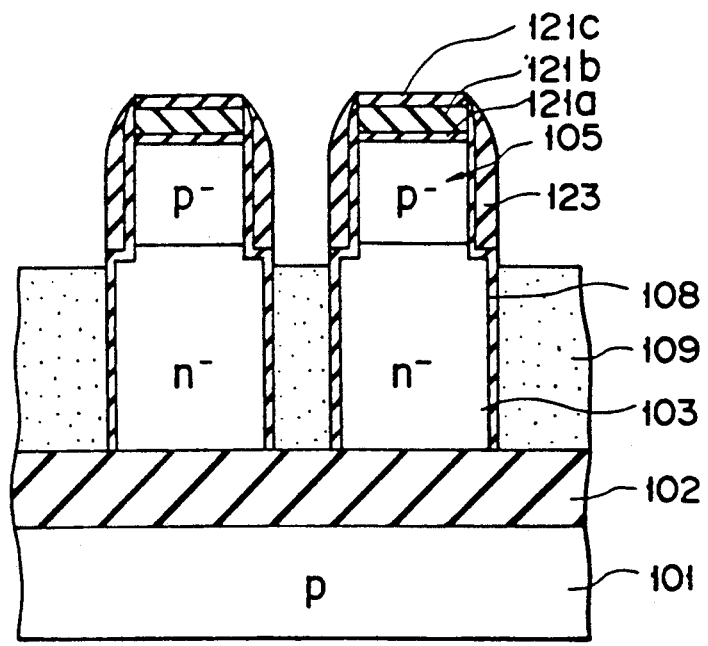

As shown in FIG. 15D, thermal oxidation is performed to form the 10-nm capacitor insulating film 108 on the side surfaces at the lower portion of the pillar projection 105. The film 108 may be a two-layered film consisting of an Si$_3$N$_4$ film deposited by CVD and an SiO$_2$ film formed by oxidizing the surface of the semiconductor structure. Alternatively, the film 108 may be a metal oxide film such as a Ta$_2$O$_5$ film, a thermal nitride film or a combination thereof.

As shown in FIG. 15D, the capacitor electrode 109 consisting of a first polycrystalline silicon film is buried in the groove 106. More specifically, the phosphorus-doped first polycrystalline silicon film is deposited to have a thickness of about 600 nm and etched by CDE using, e.g., CF$_4$ gas so that the surface of the film is substantially leveled with the step 107. In this embodiment, a maximum width of the groove 106b is about 0.6 μm. Therefore, if the polycrystalline silicon film is deposited to have a thickness of about 0.3 μm or more, its surface can be substantially flattened.

The entire surface of the semiconductor structure is etched by CDE to form the capacitor electrode 109, as shown in FIG. 15D. In this step, if RIE is used, corners of each pillar projection 105 are etched by ion sputtering. If CDE is performed, however, such a problem does not arise. If the surface is not flattened by deposition of the polycrystalline silicon film, a fluid film such as a photoresist is used to flatten the surface. By etching the entire surface such that the fluid film and the polycrystalline silicon film are etched at substantially equal etching rates, the above structure is obtained. In this manner, the MOS capacitor is formed on the side surfaces at the lower portion of each pillar projection 105 not covered with the first and second masks 121 and 123.

Figure 15E:
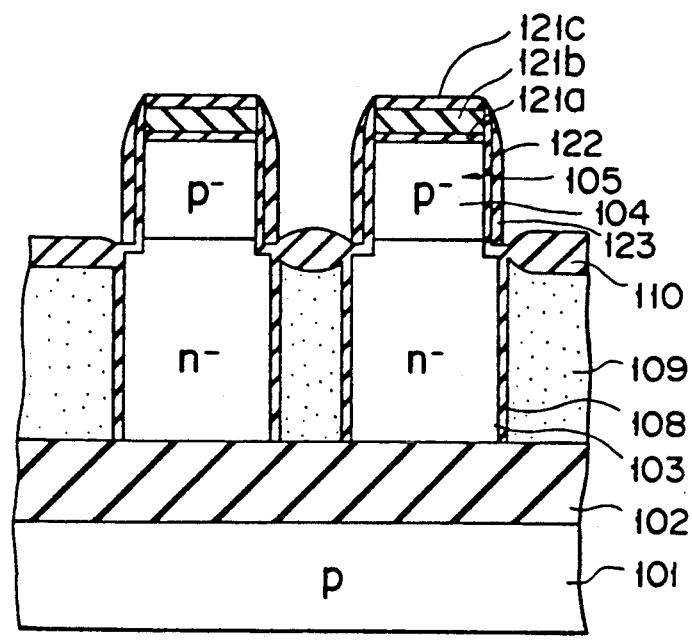

As shown in FIG. 15E, thermal oxidation is performed in, e.g., an O$_2$+H$_2$ atmosphere at 850° C. for about 15 minutes using the Si$_3$N$_4$ films 121 and 123 as masks, thereby forming the thick SiO$_2$ film 110 having a thickness of about 80 nm on the surface of the capacitor electrode 109. In this step, the capacitor electrode 109 and the gate electrode 112 of the MOSFET are isolated by the thermal oxide film 110. However, after CVD oxide film is deposited, the film may be etched back to the upper portion of the electrode 109, thereby performing isolation. If CVD is performed, a crystal defect caused by a stress produced in the thermal step can be suppressed. As a result, a data storage property of the memory cell can be improved.

The Si$_3$N$_4$ film 123 as a second mask and the underlying SiO$_2$ film 122 covering the side surfaces at the upper portion of the pillar projection 105 on which the MOSFET is to be formed are removed. Thermal oxidation is performed in an O$_2$+HCl atmosphere at a temperature of 900° C. for about 60 minutes to form the gate insulating film 111 on the side surfaces at the upper portion of the projection 105 to have a film thickness of about 20 nm.

Figure 15F:
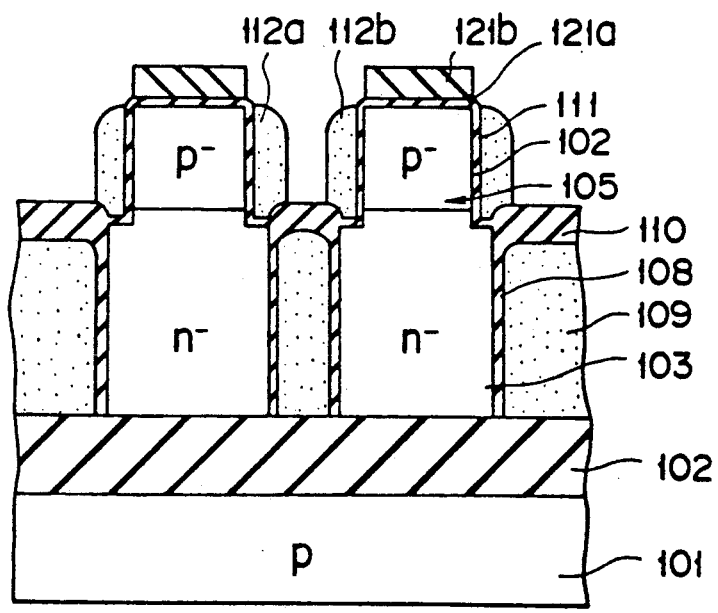

As shown in FIG. 15F, a phosphorus-doped second polycrystalline silicon film is deposited to have a thickness of about 250 nm and etched by RIE, thereby forming the gate electrode 112 on the side surfaces at the upper portion of each pillar projection 105. The electrode 112 is formed in a self-alignment manner all around the projection 105 without a mask. The electrode 112 must be continuously formed in one direction of the matrix to form word lines. For this purpose, a photoresist mask is formed in a region of the groove along the word line direction. In this manner, the MOSFET is formed on the side surfaces at the upper portion of each pillar projection 105. If the projections 105 are arranged in the word line direction at a smaller interval than a direction perpendicular to the word line direction, connection portions can be formed in a self-alignment manner without a mask layer.

Figure 15G:
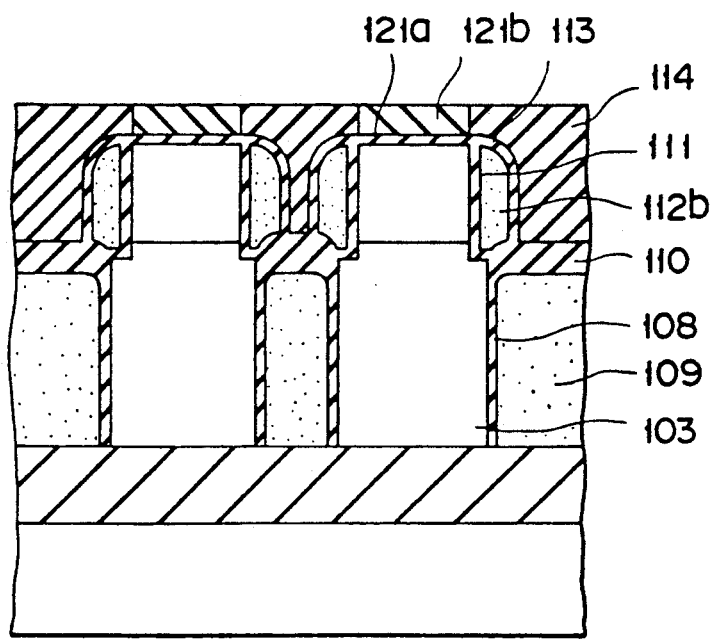

Thereafter, as shown in FIG. 15G, the surface of the gate electrode 112 is covered with the SiO$_2$ film 113 formed by thermal oxidation. A BPSG film 114, for example, is buried in the recess portion, and the entire substrate is flattened by annealing. The SiO$_2$ film 113 may be formed not by thermal oxidation but by CVD. The surface is flattened by a photoresist, and the SiO$_2$ film 113 and the BPSG film 114 are dry-etched at equal etching rates. As a result, the Si$_3$N$_4$ film 121b as an anti-oxidation mask present on the upper end face of the pillar projection 105 is exposed.

Figure 15H:
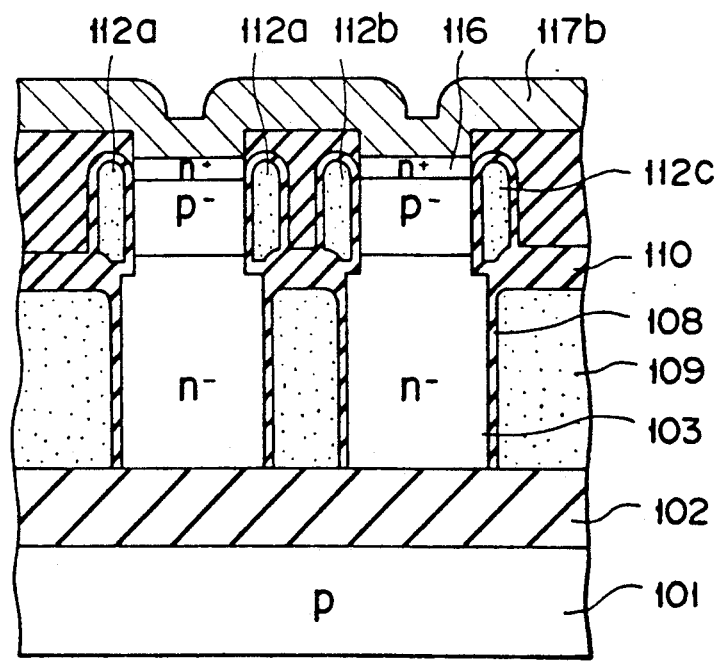

As shown in FIG. 15H, the film 121b is selectively etched by CDE using a gas containing CF$_4$ gas. Subsequently, the SiO$_2$ film 121a is removed to expose the Si substrate. Thereafter, thermal oxidation is performed in a steam atmosphere at a temperature of 850° C. to form an SiO$_2$ film on the substrate surface. The thickness of the SiO$_2$ film is about 10 nm on the upper surface of the projection 105. If the thermal oxidation is performed while the upper end of the gate electrode is located above the upper surface of each projection 15, polycrystalline silicon portions after etching can be effectively connected to each other.

As ions are implanted at a dose of $5 \times 10^{12}$ ions cm$^{-2}$ and an acceleration voltage of 40 keV via the uniform SiO$_2$ film to form the n$^+$-type layer 116 serving as a source or drain of the MOSFET in the upper end face of each pillar projection 105. If necessary, phosphorus ions may be implanted at a dose of $3 \times 10^{13}$ ions cm$^{-2}$ and an acceleration voltage of 100 keV to form an n$^-$-type layer below the layer 116, so that the MOSFET obtains an LDD structure.

An ammonium fluoride solution is used to etch the 10-nm thick SiO$_2$ film present on the upper end face of the each pillar projection 105, thereby selectively exposing only the upper surface of the projection 105.

A tungsten film W is deposited and patterned to form bit lines 117 connected to the n-type layers 116 and crossing the word lines.

In this manner, according to this embodiment, only the upper surface of each pillar projection 105 can be exposed in a self-alignment manner without a PEP step for a bit line contact.

The DRAM according to this embodiment has the following features.

That is, since an area of the substrate concerning a soft error is reduced, a soft error in a bit line mode can be reduced. Since the memory cells are micropatterned and completely isolated by the insulating layer 102, a soft error in a cell mode is significantly reduced.

In addition, in this embodiment, the bonded wafer formed by direct bonding is used as a starting material, and the oxide film formed by bonding is used as an etching stopper, thereby forming the grooves in longitudinal and transverse directions from the first substrate side by anisotropic etching. Therefore, a groove having a uniform depth can be easily formed at a high density. Also, the insulating layer for isolation can be easily buried while this is very difficult in conventional methods. All the bottom surfaces of the pillar projections 105 are formed on the insulating film 102. Since bonding strength of an interface between the bottom surface of the projection 105 and the insulating film 102 is very high, crystallinity of the projection is good. As a result, a DRAM having good element characteristics can be obtained. That is, only an interface level substantially the same as that produced in an interface between a normal thermal oxide film and silicon is produced in the interface between the MOS capacitor and the insulating film 102. For this reason, leakage between immediately adjacent MOS capacitors can be suppressed, and an electric charge retention property of the DRAM is improved.

The bit line is connected to the source or drain of the MOSFET in a self-alignment manner without a contact hole formation step including photolithography. For this reason, since no alignment margin is required as in the photolithography, the size of the upper end face of the pillar projection 105 is not limited by an alignment margin unlike in conventional structures. As a result, since the pillar projection 105 can be minimized to a patterning limit size, the memory cells can be micropatterned, and a high packing density and a large capacity of the DRAM can be realized.

Since the MOS capacitor is formed by utilizing all the side surfaces at the lower portion of the projection 105, a relatively large storage capacity is assured.

Since the MOSFET is formed by utilizing all the side surfaces at the upper portion of the projection 105, a channel width can be increased. Therefore, the channel length or the thickness of the gate insulating film need not be decreased in order to obtain a large channel conductance. A DRAM having good characteristics can be obtained such that a threshold value variation caused by hot electrons is small.

The step 107 is formed in the middle of the pillar projection 105. The $n^-$-type layer 103 serving as a memory node is formed to have a height substantially equal to that of the step 107 or is located closer to the channel side than that. That is, the junction surface between the $n^-$-type layer 103 and the channel layer 104 is located at the same level or higher than the step 107. As a result, the characteristics of the MOSFET formed on the side surfaces at the upper portion of each pillar projection are improved. That is, the layer 103 serving as a memory node also serves as the source or drain of the MOSFET. If the layer 103 would be formed lower than the step 107, the channel region of the MOSFET would be curved at the step 107. Therefore, since the channel length is not determined by a straight length of the side surface of the projection 105, the threshold voltage of the MOSFET may be increased by the presence of corners. Therefore, when the source and drain are switched, asymmetry is produced in current characteristics. As in this embodiment, when the layer 103 is formed at a position at least at the same level as or higher than the step 107 and the channel region is formed above the step 107, the above problem can be solved.

Furthermore, with the above arrangement, since the shape of the source and drain can be made symmetric vertically along the pillar projection 105, the MOSFET characteristics can be symmetric.

In the method of this embodiment, the first groove is formed in the substrate by using the first mask. Thereafter, the second mask is formed on the side surfaces of the first groove, and the second groove is formed in the bottom portion of the first groove so as to reach the insulating layer 102. Since the second groove having a uniform depth can be formed in a chip by this step, the surface areas of the $n^-$-type layers in all memory cells can be substantially uniform.

If etching is performed while the selectivity of the silicon layer with respect to the insulating layer 102 is high, etching of the second groove is stopped at the insulating layer 102. Therefore, an etching margin of the second groove is greatly improved to increase the yield of products.

Since the first mask used in groove formation remains to immediately before the final step, bit line contacts can be self-aligned. As a result, the memory cells can be micropatterned.

In the above embodiment, the open bit line type DRAM has been described. The present invention, however, can be similarly applied to a folded bit line type DRAM. In the case of the folded bit line type DRAM, pillar projection arrays are formed offset from each other by a half-pitch word line every array in a bit line forming direction.

FIGS. 17A and 17B show a method of forming bit line contacts by normal photolithography and RIE.

As in the embodiment shown in FIGS. 15A to 15H, an insulating film 113 is formed on the surface of a gate electrode 112, and then a borophosphosilicate glass (BPSG) film 114, for example, is deposited on the entire surface. A semiconductor structure is processed at a temperature of about 950° C. to cause the BPSG film 114 to flow, thereby flattening the semiconductor structure. A contact hole is formed in an upper portion of each pillar projection 105 by normal photolithography and RIE, and an n-type impurity is doped in the upper surface of the projection 105 by, e.g., ion implantation to form an $n^+$-type layer 116. It is preferred to form an $n^+$-type layer on the entire surface of the p-type impurity layer 104 by ion implantation before formation of the pillar projections 105.

Thereafter, a polycrystalline silicon film, for example, is deposited to have a thickness of about 100 nm by CVD, and arsenic (As) is doped by, e.g., ion implantation. The source or drain layer 116 on the upper end of each pillar projection is electrically connected to the polycrystalline silicon film and patterned, thereby forming bit lines 117. At this time, in order to reduce a resistance of the bit line, a so-called polycide structure in which a refractory metal silicide such as molybdenum silicide or a refractory metal such as tungsten (W) is deposited on a polycrystalline silicon film may be used.

According to this modification, similar to the above embodiment, a structure in which a soft error can be suppressed is obtained. In addition, a structure in which hot electrons can be reduced is obtained. Also, isolation of the adjacent MOS capacitors can be reliably performed.

A modification in which memory cells of the present invention are formed together with peripheral circuits will be described below with reference to FIGS. 18A and 18B.

In this modification, an insulating layer 152 is formed on an entire region at an upper portion of a substrate 151. For this reason, a structure of this modification can suppress a soft error due to, e.g., α-rays. In addition, an $n^-$-type layer 153 serving as a memory node is formed only below a memory cell region. If necessary, however, the layer 153 may be formed below another region, e.g., an n-type well. If a DRAM is arranged as a so-called bi-CMOS device using a combination of bipolar and CMOS elements, the $n^-$-type layer 153 may be used as a buried n-type layer of a bipolar element formation region, e.g., a collector. In this manner, the layer 153 can be formed not on the entire surface but on an arbitrary region.

A p-type layer 154a is selectively formed as a channel region of a MOSFET of a memory cell. The layer 154a, however, can be used as a channel region of another peripheral circuit. If a channel region having a concentration different from that of the layer 154a is required as a peripheral circuit, a $p^-$-type well layer 154b or $n^-$-type well layer 154c can be selectively formed by using ion implantation and thermal diffusion using normal photolithography. In this case, a substrate potential may be supplied to the peripheral circuit from each well.

At the memory cell portion, the channel region 154a is formed into a pillar projection shape so as to be isolated from other regions. Therefore, the substrate potential cannot be given to the MOSFET of the memory cell. The MOSFET of this modification, however, has a specific shape surrounded by the gate electrode. Therefore, since controllability of the gate electrode to the channel region is very strong, sufficient cutoff characteristics can be obtained even if the substrate potential is floating.

In this modification, the word line at the memory cell portion and the gate electrode 168 at the peripheral circuit are independently formed. The word line 162 and the gate electrode 168, however, may be simultaneously formed. In this manner, manufacturing steps can be simplified.

In the above embodiment, in order to adjust the threshold value of the MOSFET, ion implantation is performed for the entire substrate surface to the depth corresponding to a MOSFET formation region before groove formation, thereby forming the p-type layer. The p-type layer need only be present on at least the side surface portion as the MOSFET formation region of the pillar projection. Therefore, for example, after the pillar projections are formed and the capacitor electrodes are buried, ion implantation may be performed for the side surfaces at the upper portion of each pillar projection to adjust the impurity concentration at only the channel region. In this case, since ion implantation must be performed for the substantially vertical side surfaces, oblique ion implantation including rotation of the wafer is performed. By this ion implantation, an impurity is doped uniformly in the side surfaces. The wafer may be continuously rotated or intermittently rotated by 90° C.

Examples of the bit line material are, in addition to the W film and the Al-Si-Cu film described in the embodiment, another refractory metal such as molybdenum, a refractory metal silicide, or a combination of these metals and a polycrystalline silicon film.

In the above embodiment, the substrates are directly bonded. A substrate layer, however, may be formed to have an insulating layer by an SOI technique using laser annealing. If necessary, an insulating layer may be formed in a lattice manner in the wafer so that all the lower surfaces of the pillar projections are located on the insulating layer.

In the above embodiment, one end of the MOS capacitor is in contact with the insulating layer in the substrate. Only an interface level substantially the same as that produced in an interface between a normal thermal oxide film and silicon is produced in an interface between the MOS capacitor and the insulating layer. For this reason, since leakage between the immediately adjacent MOS capacitors can be suppressed, a electric charge retention property of the DRAM can be improved.

In the above embodiment, the oxide films are formed on the surfaces of the two silicon substrates to be bonded. The oxide film, however, may be formed on the surface of only one of the substrates, e.g., the substrate 101S. In addition, in the above embodiment, the MOSFET is formed on the side wall at the upper portion of each pillar projection. However, the electrode of the MOS capacitor may be buried to the upper portion of the groove to form a frame-like gate electrode of the MOSFET on the upper surface of the pillar projection. Ion implantation for forming a source or drain region may be performed for the upper surface of the pillar projection through an opening formed in the gate electrode. Thereafter, the bit line may be connected to the source or drain region to form the MOSFET on the surface of the pillar projection.

A DRAM according to a third embodiment of the present invention will be described below with reference to FIGS. 19A to 19C.

Figure 19A:
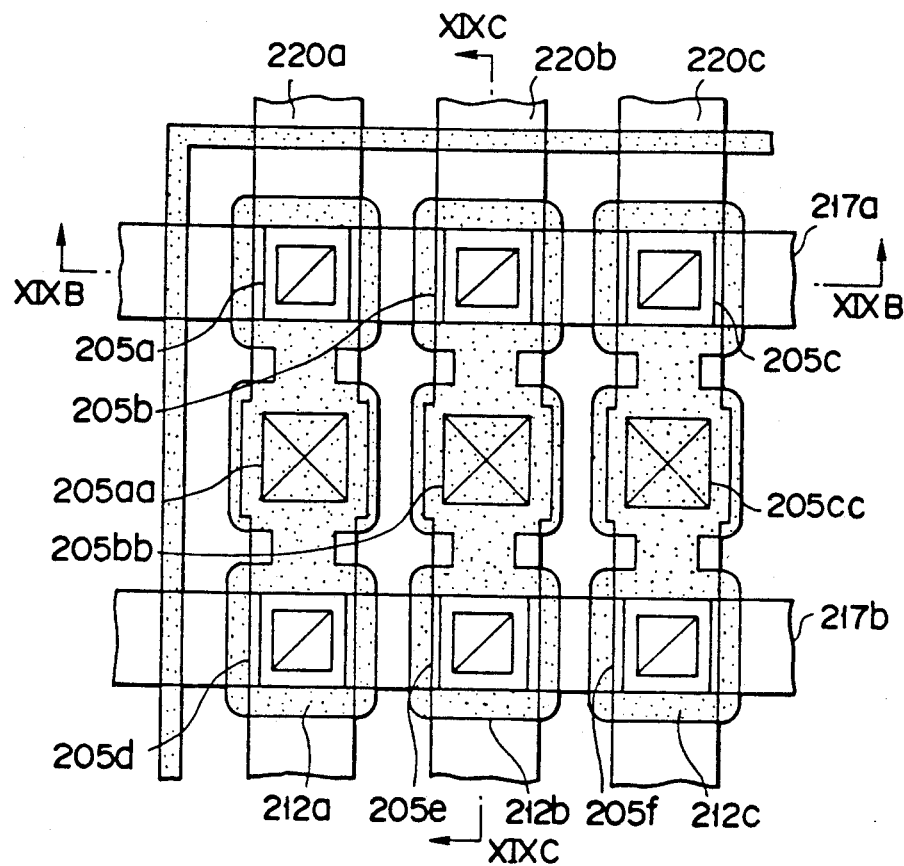
FIG. 19A is a plan view showing a DRAM according to a third embodiment of the present invention.
Figure 19B:
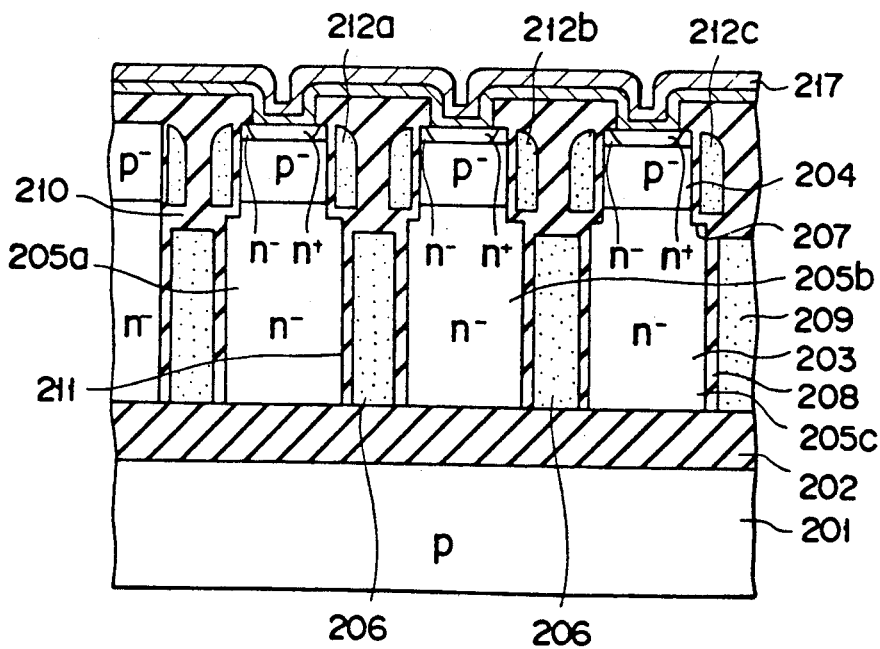
FIG. 19B is a sectional view taken along a line XIXB—XIXB in FIG. 19A.
Figure 19C:
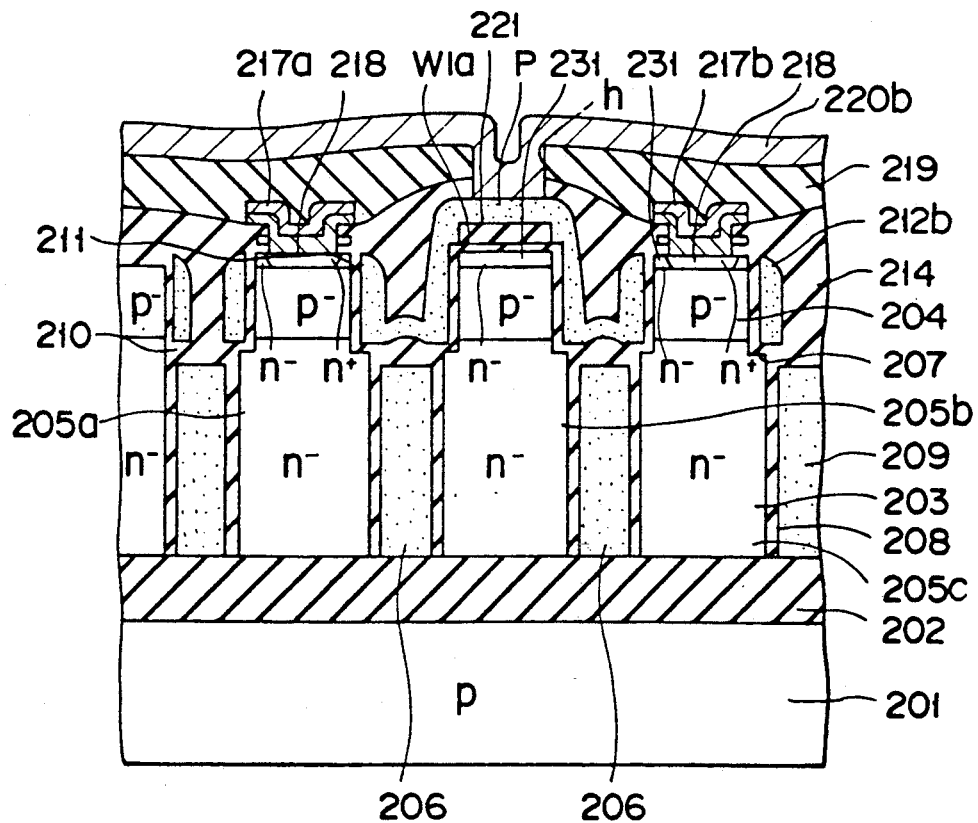
FIG. 19C is a sectional view taken along a line XIXC—XIXC in FIG. 19A.

FIG. 19A is a plan view showing a six-bit DRAM portion.

An $n^-$-type layer 203 serving as a memory node of a MOS capacitor and a $p^-$-type layer 204 serving as a channel region of a MOSFET are stacked on a silicon oxide film 202 formed on the surface of a p-type silicon substrate 201. A plurality of pillar projections 205a, 205b, 205c and 205d separated by grooves 206 formed in longitudinal and transverse directions in the substrate are arranged in a matrix manner.

Pillar projections 205aa, 205bb and 205cc located at the centers of pillar projection arrays do not form memory cells. A gate electrode material is provided above the upper surface of each of the projections 205aa, 205bb and 205cc with an insulating layer 21 interposed therebetween, and a contact pad is formed thereon.

A MOSFET and a MOS capacitor are formed on side surfaces at upper and lower portions, respectively, of each of pillar projections 205a, 205b, 205c, 205d, 205e and 205f formed at both sides of the projections 205aa, 205bb and 205cc having the contact pads thereon, thereby constituting memory cells.

A step 207 is formed on the side surfaces of each of the projections 205a, 205b, 205c, 205d, 205e and 205f. A portion below a position slightly above the step 207 is the n⁻-type layer 203 serving as a memory node. A capacitor insulating film 208 is formed on all the side surfaces at the lower portion of each projection 205. A capacitor electrode 209 is buried in the grooves 206. The MOS capacitor is constituted by the layer 203, the film 208 and the electrode 209. A boundary between the n⁻-type layer 203 and the channel layer 204 is set to substantially coincide with or higher than the position of the step 207. The capacitor electrode is continuously formed as a plate electrode common for all the memory cells and extracted as an electrode at a peripheral portion of the DRAM.

The silicon oxide layer 202 is formed under bottom portions of the grooves 206 and the pillar projections 205. The layer 102 serves as an insulating layer for element isolation and for preventing soft errors caused by $\alpha$-rays.

Gate electrodes 212a, 212b and 212c are formed on the side surfaces at the upper portions of the projections 205a, 205b and 205c, respectively, with the gate insulating films 211 interposed therebetween. Each gate electrode 212 and the capacitor electrode 209 are vertically stacked in each groove 206 and are isolated by a corresponding insulating film 210. The gate electrodes 212 surround the pillar projections 205a, 205b, 205c, 205d, 205e and 205f with the gate insulating films 211 each having a film thickness of about 20 nm interposed therebetween, and are continuously formed in one direction of the matrix to serve as word lines. A gate insulating film 213 is buried in recess portions of the grooves 206 except for the buried gate electrodes 212 to flatten the semiconductor structure.

The surface of the substrate in which the capacitor electrodes 209 and the gate electrodes 212 are buried is covered with the insulating film 213, and bit lines 217a and 217b consisting of, e.g., a molybdenum polycide film are formed thereon. An n⁻-type layer 231 serving as a source or drain of the MOSFET is formed in the upper end face of each of the projections 205a, 205b, 205c, 205d, 205e and 205f by diffusion. Each bit line 217 is directly connected in a self-alignment manner to a corresponding n⁺-type contact layer 218 formed in the layer 231 by diffusion without a PEP step for forming a contact hole.

A part of a composite film of a silicon oxide film and a silicon nitride film used as a first mask 221 for forming a first groove, i.e., the insulating film 221 consisting of 10-nm thick silicon oxide film 221a and a 20-nm thick silicon nitride film 221b remains on the upper end face of each of the pillar projections 205aa, 205bb and 205cc constituting the contact pads. The polycrystalline silicon layer 212 connected to one of word lines 220a, 220b and 220c of adjacent bits constituting single blocks remains on each insulating film 221. Each layer 212 constitutes a contact pad P. The shunt lines 220a, 220b and 220c for the word lines are connected to the corresponding contact pads P through contact holes h formed in the insulating film 219.

In the above structure, the insulating film 221 remains on the n⁻-type layer 231 formed in the upper end face of each of the projections 205aa, 205bb and 205cc each constituting the contact pad. Since a gate breakdown caused by a high electric field can be prevented by the insulating film 221, high reliability of the DRAM can be maintained. The film 221 must be thicker than the gate insulating film of the MOSFET, e.g., need to have a thickness of about 100 nm.

A method of manufacturing the above DRAM will be described below with reference to FIGS. 20A to 20H.

Figure 20A:
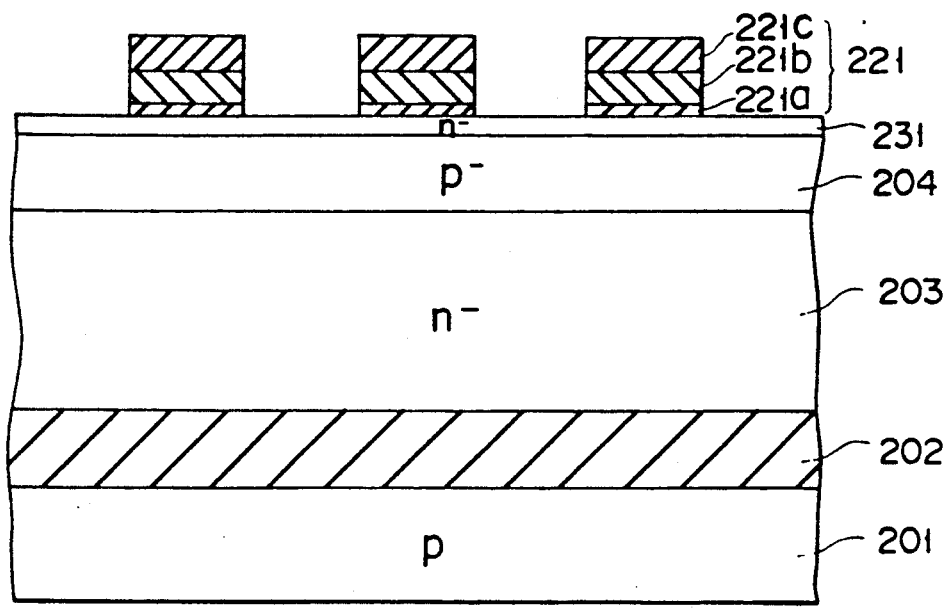
FIGS. 20A to 20H are sectional views showing a method of manufacturing the DRAM shown in FIGS. 19A to 19C.

As shown in FIG. 20A, the SiO₂ film 202 having a thickness of about 800 nm is formed as an insulating film on the p-type silicon substrate 201. The 3-μm thick n⁻-type layer 203 serving as a memory node is formed on the film 202 by thermal diffusion of, e.g., antimmony (Sb), and the p⁻-type layer 204 serving as a channel region of the MOSFET is formed thereon.

The substrate having these layers are formed by the method as shown in FIGS. 16A to 16E.

When the wafer bonding method of the present invention is to be used, the underlying support substrate 201 may be either a p⁻- or n⁻-type substrate and is not particularly specified.

As shown in FIG. 20A, arsenic ions are implanted in the two-layered substrate formed as described above at an acceleration energy of 100 keV and a dose of $4 \times 10^{13}$ ions/cm², thereby forming the n⁻⁻-type layer 231 serving as a source or drain of the MOSFET. Thereafter, the first masks 221 are formed by normal photolithography lithography to cover the memory cell regions. More specifically, each first mask 221 consists of a 10-nm thick SiO₂ film 221a formed by thermal oxidation, a 200-nm thick Si₃N₄ film 221b as an anti-oxidation film deposited by CVD and a 600-nm thick SiO₂ film 221c deposited by CVD.

Figure 20B:
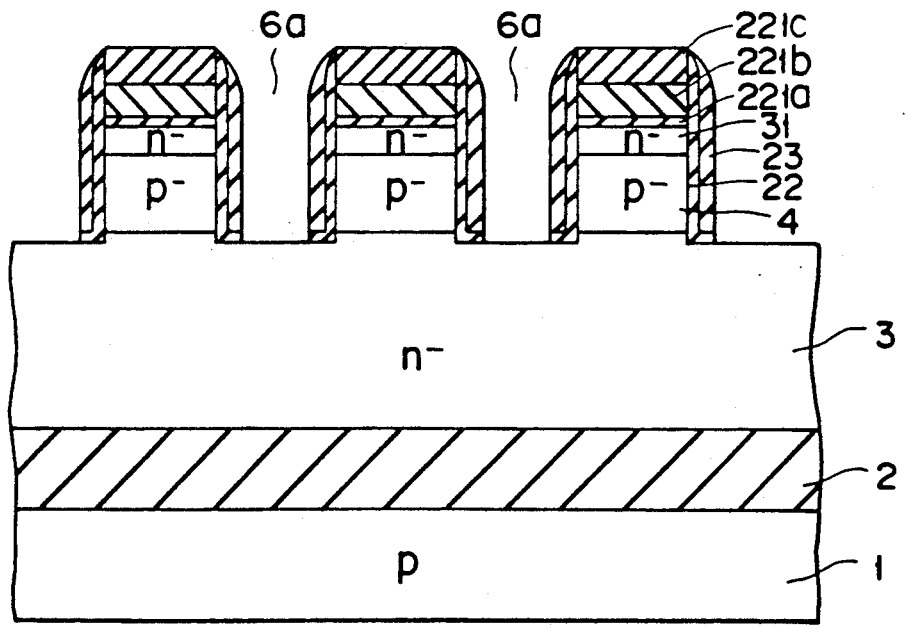

As shown in FIG. 20B, the layer 204 is etched to form first grooves 206a reaching the layer 203 by reactive ion etching (RIE) using the first masks 221 as etching masks. A plurality of pillar projections 205 are defined by the grooves 206a. Thereafter, an Si₃N₄ film 223 serving as an anti-oxidation second mask is formed on the side surfaces of each projection 205. More specifically, a 20-nm thick SiO₂ film 222 is deposited by CVD, and the 200-nm thick Si₃N₄ film 223 is deposited thereon by CVD. The entire surface is then anisotropically etched by RIE so that the two-layered film is self-aligned on only the side surfaces of each projection 205.

Figure 20C:
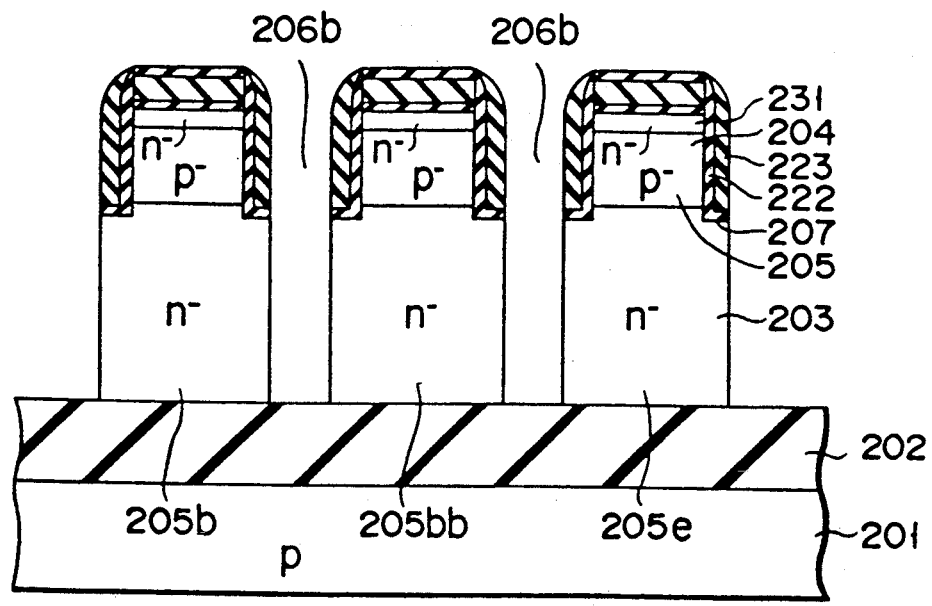

As shown in FIG. 20C, by using the first and second masks as anti-etching masks, the n-type layer 203 is etched by RIE using chlorine gas to form 3-μm deep second grooves 206b reaching the insulating layer 202. In this manufacturing step, the step 207 is formed on the side surfaces of each pillar projection 203. Thereafter, a predetermined post-treatment is performed to the etched surface. At this time, a surface impurity concentration of the layer 203 is about $1 \times 10^{19}$ atoms cm⁻³.

Figure 20D:
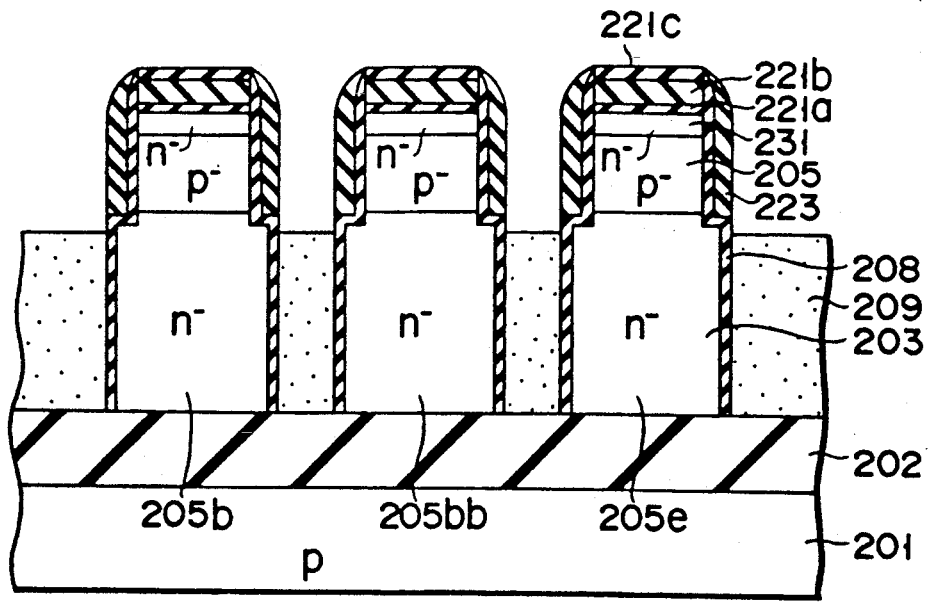

As shown in FIG. 20D, the 10-nm thick capacitor insulating film 208 is formed on the side surfaces at the lower portion of each projection 205. The film 208 may be a two-layered film consisting of an Si₃N₄ film deposited by CVD and an SiO₂ formed by oxidizing the surface of the Si₃N₄ film. Alternatively, the film 208 may be a metal oxide film of, e.g., Ta₂O₅, a thermal nitride film, or an arbitrary combination thereof. The capacitor electrode 209 consisting of a first polycrystalline silicon film is buried in the grooves 206. More specifically, the phosphorus-doped first polycrystalline silicon film is deposited to have a thickness of about 600 nm and etched by CDE using, e.g., CF₄ gas so that its surface is set at a position substantially equal to that of the step 207. In this embodiment, a maximum width of the groove 206b is about 0.6 μm. Therefore, when the polycrystalline silicon film having a thickness of about 0.3

μm or more is deposited, its surface is substantially flattened. The entire surface of the semiconductor structure is etched by CDE to bury the capacitor electrode 209 as shown in FIG. 20D. In this manufacturing step, if RIE is used, corner portions of each projection 205 are etched by ion sputtering. If CDE is used, however, such a problem is not posed. If the surface is not flattened by deposition of the polycrystalline silicon film, a fluid film such as a photoresist is used to flatten the surface. The above structure is obtained by etching the entire surface such that the fluid film and the polycrystalline silicon film are etched at substantially equal etching rates. In this manner, the MOS capacitor is formed on the side surfaces at the lower portion of each projection 205 not covered with the first and second masks 221 and 223.

Figure 20E:
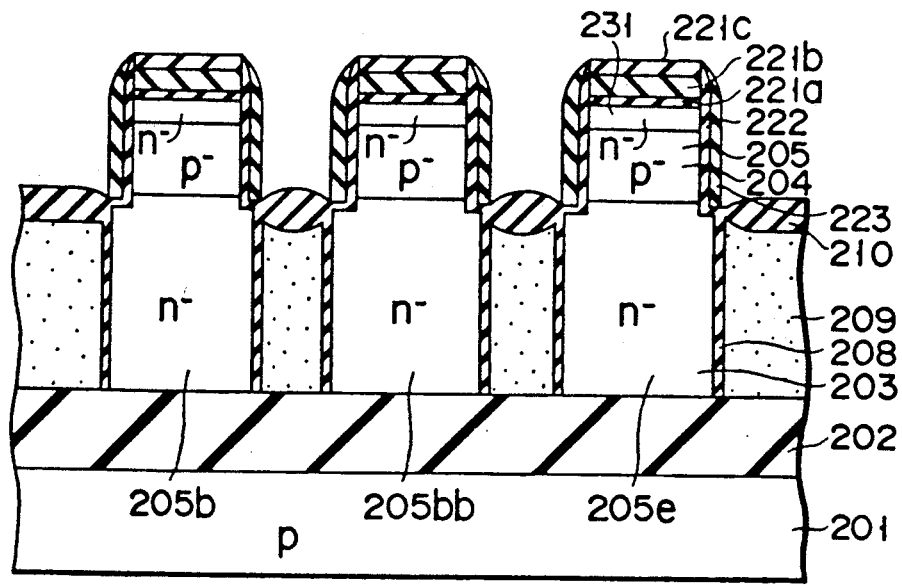

As shown in FIG. 20E, thermal oxidation is performed in an $O_2+H_2$ atmosphere at 850° C. for about 15 minutes by using the $Si_3N_4$ films 221 and 223 as masks to form thick $SiO_2$ film 210 having a thickness of about 80 nm on the surface of the capacitor electrode 209. In this manufacturing step, the capacitor electrode 209 and the gate electrode 212 of each MOSFET are isolated from each other by the thermal oxide film 210. However, a CVD oxide film may be deposited and etched back to the upper portion of the capacitor electrode 209, thereby performing isolation. Since crystal defects caused by a stress produced in a thermal step can be suppressed if CVD is used, a data storage property of each memory cell can be improved.

The $Si_3N_4$ film 223 as the second mask and the underlying $SiO_2$ film 222 covering the side surfaces at the upper portion of each projection 205 on which the MOSFET is to be formed are removed. Thermal oxidation is performed in an $O_2+HCl$ atmosphere at a temperature of 900° C. for about 60 minutes to form the gate insulating film 211 on the side surfaces at the upper portion of the projection 205 to have a thickness of about 20 nm.

Figure 20F:
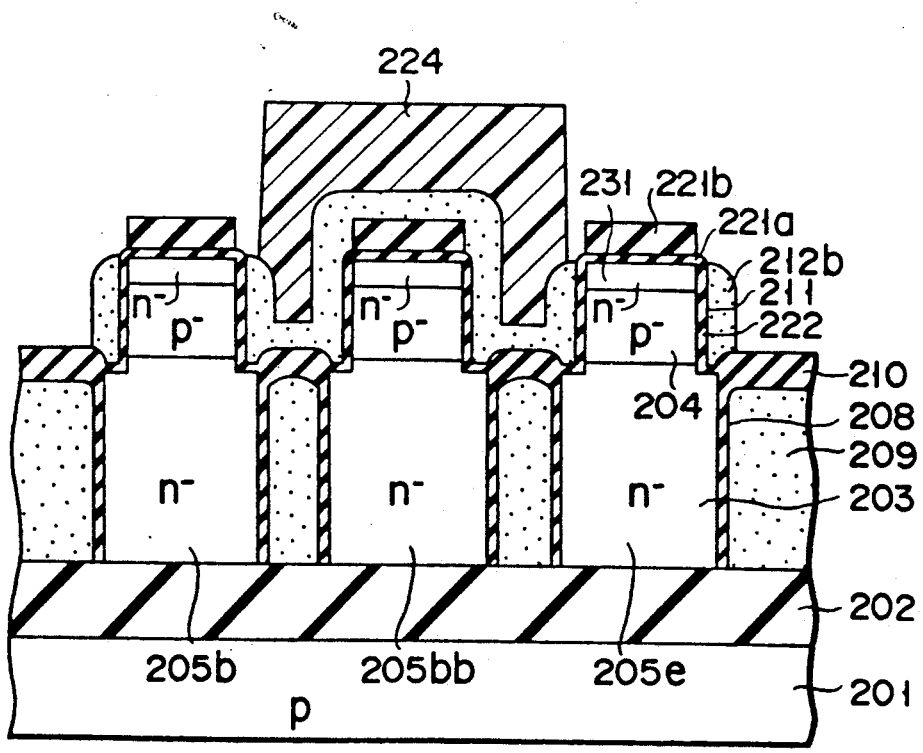

Thereafter, as shown in FIG. 20F, a phosphorus-doped second polycrystalline silicon film is deposited to have a thickness of about 250 nm and etched by RIE, thereby forming the gate electrode 212 on the side surfaces at the upper portion of the projection 205. The gate electrode 212 is self-aligned all around the projection 205 without using a mask. The gate electrodes 212 are connected in units of blocks. At the same time, the second polycrystalline silicon film is caused to remain on the upper surfaces of the contact pillar projections 205aa, 205bb and 205cc, thereby constituting the word lines. For this purpose, a photoresist film 224 is formed on regions above the projections 205aa, 205bb and 205cc. If the projections 205 are arranged in a word line direction at an interval smaller than that in a direction perpendicular to the word line direction, connection portions can be self-aligned. In this case, therefore, a photoresist film (mask) need not be formed on regions of the grooves along the word line. Therefore, the photoresist film 224 need only be formed on the upper surface regions of the projections 205aa, 205bb and 205cc, thereby improving patterning precision.

Figure 20G:
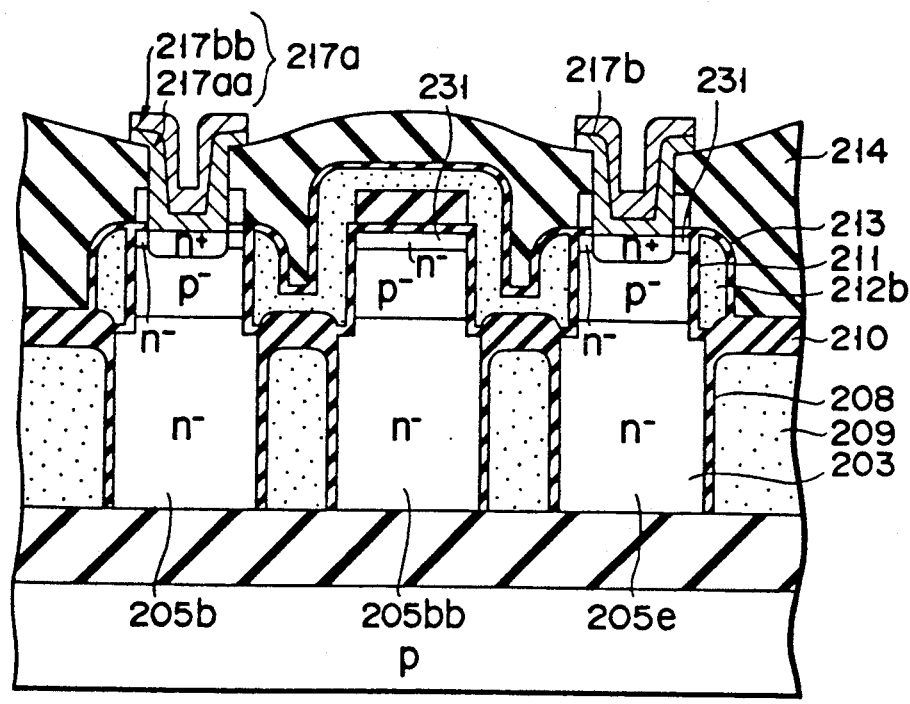

As shown in FIG. 20G, the film 224 is removed, and the surface of the gate electrode 212 is covered with the $SiO_2$ film 213. A BPSG film 214 is buried in recess portions, and the overall substrate is flattened by annealing. The $SiO_2$ film 213 may be formed not by thermal oxidation but by CVD.

Thereafter, bit line contacts are formed in the upper surfaces of the projections 205b and 205e. Bit lines 217a and 217b each having a polycide structure consisting of a molybdenum film and a polycrystalline silicon film are connected to the upper surfaces of the projections 205b and 205e. That is, a 50-nm thick polycrystalline silicon film 217aa is deposited on the exposed upper surface of each of the projections 205b and 205e, and arsenic ions are implanted in the film 217aa at an acceleration voltage of 60 keV and a dose of $5\times 10^{15}$ ions/cm$^2$. A 20-nm thick molybdenum silicide film 217bb is deposited on the film 217aa. The films 217aa and 217bb are patterned by normal photolithography. At this time, arsenic is diffused from the polycrystalline silicon film 217aa in which arsenic is doped at a high concentration into the upper surface of the projection 205 to form an n+-type layer 218 in the n⁻-type layer 231 constituting the source or drain. In this manufacturing step, contact resistances between the layers 231 in the upper surfaces of the projections 205b and 205e and the bit lines 217a and 217b can be reduced. Since the bit line has a polycide structure, an electrical resistance of wiring itself is low.

Figure 20H:
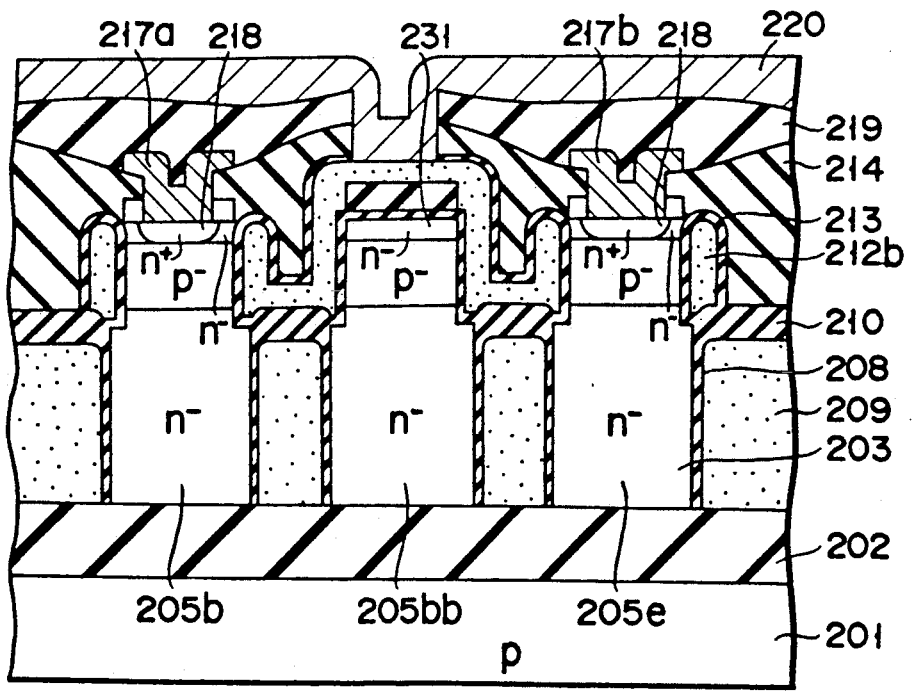

As shown in FIG. 20H, the surface of each bit line 217 is oxidized to form a 50-nm thick oxide film, and a BPSG film 219 is deposited on the entire surface to have a thickness of about 800 nm and flattened by annealing. Thereafter, a contact hole is formed in the gate electrode 212b on the upper surface of the projection 205bb by normal photolithography, thereby forming each word shunt line 220 consisting of an aluminum layer.

The DRAM according to this embodiment has the following features.

The gate electrodes 212 constituting the word lines need not be extended from the end portion of a memory cell array over the grooves. Each of the contact pillar projections 205aa, 205bb and 205cc is formed in each block, and the word shunt line 220 is extracted from the contact pad P on the upper surface of each pillar projection. Therefore, even if a gate electrode material 250 remains on side walls of a step present at the end portion of a memory cell array (see FIG. 19A), the word shunt lines 220a, 220b and 220c are not short-circuited with each other. As a result, the yield of the DRAM can be improved.

Since the contact pad P is formed on the insulating film used as a mask for formation of the grooves 206, no gate breakdown occurs even if a high electric field is applied.

In this embodiment, the word line is not extracted from the end portion of each block but from the center thereof. In addition, the word shunt line 220 consisting of an aluminum layer is formed after the surface of the semiconductor structure is flattened in units of blocks. Therefore, a word line resistance is decreased as a whole to increase an operation speed.

Furthermore, since an etching step for preventing short-circuiting between the gate electrodes need not be performed, manufacturing steps can be simplified.

In addition to the above advantages, a soft error can be suppressed because an area of the substrate concerning soft errors is decreased. Also, since the memory cells are micropatterned and completely isolated by the insulating layer 202, a soft error in a cell mode is significantly suppressed.

In this embodiment, the bonded wafer obtained by direct bonding is used as a starting material, the oxide film formed by bonding is used as an etching stopper, and the grooves are formed in the longitudinal and transverse directions from the first substrate side by anisotropic etching. Therefore, the grooves having a uniform depth can be easily formed at a high density. In addition, the insulating layer for isolation can be easily buried, while this is difficult in conventional structures. All the bottom surfaces of the pillar projections 205 are formed on the insulating film 202. Since bonding strength at an interface between the bottom surface of each projection 205 and the insulating film 202 is good, a crystallinity of the projection 205 is high. Therefore, a DRAM having excellent element characteristics can be manufactured. That is, an interface level substantially the same as that produced in an interface between a normal thermal oxide film and silicon is produced in the interface of the MOS capacitor and the film 202. For this reason, leakage between the MOS capacitors very close to each other can be suppressed. As a result, an electric charge retention property of the DRAM is improved Since each MOS capacitor is formed by utilizing all the side surfaces at the lower portion of the pillar projection 205, a relatively large storage capacity is assured.

Also, since each MOSFET is formed by utilizing all the side surfaces at the upper portion of the projection 205, a channel width can be increased. Therefore, the channel length or thickness of the gate insulating film need not be decreased in order to obtain a high channel conductance. As a result, a DRAM having good characteristics in which a threshold variation caused by hot electrons is small can be manufactured.

The step 207 is formed in the middle of each pillar projection 205. The n⁻⁻-type layer 203 serving as a memory node is formed to have a height substantially equal to that of the step 207 or formed at a position closer to the channel side. That is, a junction surface between the n⁻⁻-type layer 203 and the channel layer 204 is formed at a position equal to or higher than that of step 207. For this reason, characteristics of the MOSFET formed on the side surfaces at the upper portion of each pillar projection are improved. That is, the n⁻⁻-type layer 203 serving as a memory node also serves as the source or drain of the MOSFET. Therefore, if the layer 203 is formed lower than the step 207, the channel region of the MOSFET is curved at the step 207. In this case, the channel length is not determined by a straight length of the side surface of the projection 205, and a threshold voltage of the MOSFET is increased because corners are present. Therefore, when the source and drain are switched, current characteristics are asymmetric. As in this embodiment, when the layer 203 is formed at least at the same level as or higher than the step 207 and the channel region is formed above the step 207, the above problem can be solved.

In addition, with the above arrangement, since the shape of the source and drain can be made symmetric vertically along the pillar projection 205, the MOSFET characteristics can be symmetric.

In the method of this embodiment, the grooves are formed in the substrate by using the first masks. The second mask is formed on the side surfaces of the first grooves to form the second grooves reaching the insulating layer 202 on the bottom portions of the first grooves. In this step, since the second grooves having a uniform depth can be formed in the chip, surface areas of the n⁻⁻-type layers of the memory cells can be substantially uniformed.

If etching is performed while selectivity of the silicon layer with respect to the insulating layer 202 is high, etching of the second grooves is stopped at the insulating layer 202. Therefore, the margin of etching of the second groove is significantly improved to improve the yield of products.

Since the first mask used in groove formation remains immediately before the final step, the bit line contacts are self-aligned. As a result, the memory cells can be micropatterned.

In the above embodiment, an open bit line type DRAM has been described. The present invention, however, can be similarly applied to a folded bit line type DRAM. In the case of the folded bit line type DRAM, pillar projection arrays are formed such that every other arrays in a bit line formation direction are offset from each other by a half word line pitch.

At the memory cell portion, the channel region 204 is formed to have a pillar projection shape and therefore isolated from other regions. Therefore, a substrate potential cannot be applied to the MOSFET of each memory cell. The MOSFET of this embodiment, however, is formed to have a specific shape surrounded by the gate electrode and therefore precisely controls the channel region of the gate electrode. Therefore, even if the substrate potential is floating, sufficient cut-off characteristics can be obtained.

In the above embodiment, the pillar projections 205 corresponding to two bits are formed at both sides of the contact pillar projections 205aa, 205bb and 205cc. As shown in FIG. 21, however, pillar projections corresponding to four bits may be formed at the both sides of the projections 205aa, 205bb and 205cc.

Examples of the bit line material are, in addition to the W film and the Al-Si-Cu film described in the embodiment, another refractory metal such as molybdenum, a refractory metal silicide, and a combination of these metals with a polycrystalline silicon film.

In the above embodiment, the substrates are directly bonded. However, a substrate layer having an insulating layer may be formed by an SOI technique using, i.e., laser annealing. If necessary, the insulating layer may be formed on the wafer in a matrix manner so that all the lower surfaces of the pillar projections are located on the insulating layer. In addition, in order to isolate MOS capacitors of adjacent bits, the insulating layer may be formed on only regions close to the pillar projections.

In this embodiment, one end of each MOS capacitor is in contact with the insulating layer in the substrate. Only an interface level substantially the same as that produced in an interface between a normal thermal oxide film and silicon is produced in an interface between the MOS capacitor and the insulating layer. For this reason, leakage between MOS capacitors very close to each other can be suppressed. As a result, an electric charge retention property of the DRAM can be improved.

In the above embodiment, the oxide films are formed on the surfaces of both the silicon substrates upon bonding. The oxide film, however, may be formed on only one of the substrates, e.g., the substrate 201S. In the above embodiment, the MOSFET is formed on the side walls at the upper portion of each pillar projection. The electrode of the MOS capacitor, however, may be buried in the upper portion of the groove to form the frame-like gate electrode of the MOSFET on the upper surface of the pillar projection. Ion implantation is then performed to form a source or drain region in the upper surface of the pillar projection through an opening formed in the gate electrode. Thereafter, a bit line is connected to the source or drain region, thereby forming the MOSFET on the upper portion of the pillar projection.

What is claimed is:

1. A method for manufacturing a dynamic RAM, comprising the steps of:

selectively forming a first mask including an anti-oxidation film on semiconductor substrate;

anisotropically etching said semiconductor substrate by using said first mask to form first grooves in longitudinal and transverse directions in said semiconductor substrate, thereby forming a plurality of semiconductor pillar projections;

forming a second mask including an anti-oxidation film on entire side surfaces of each of said semiconductor pillar projections;

anistropically etching said semiconductor substrate by using said first and second masks as anti-etching masks to form second grooves in said first grooves, said first grooves thereby having widths which are larger than those of said second grooves, thereby forming steps at boundaries of said first and second grooves;

forming a first diffusion layer serving as a memory node in side surfaces at a lower portion of each of the semiconductor pillar projections by using a portion of said first and second masks as anti-diffusion masks;

forming an element isolation layer on entire bottom portions of said second grooves;

forming a capacitor insulating film on the first diffusion layer on the side surfaces at the lower portion of each of the semiconductor pillar projections;

burying a capacitor electrode in said second grooves;

covering a surface of said capacitor electrode with a first insulating film;

removing said second mask to form a gate electrode on the side surfaces at an upper portion of each of the semiconductor pillar projections with a gate insulating film interposed therebetween;

covering a region except for a surface of said first mask with a second insulating film including a material different from that of said first mask;

removing said first mask to expose an upper end face of each of the semiconductor pillar projections;

forming a second diffusion layer serving as one of a source and a drain in the exposed upper end face of each of the semiconductor pillar projections; and forming and patterning a conductor film to form a bit line to be connected to said second diffusion layer.

2. A method for manufacturing a dynamic RAM, comprising the steps of:

selectively forming a first mask including an anti-oxidation film on a semiconductor substrate;

anisotropically etching said semiconductor substrate by using said first mask to form first grooves in longitudinal and transverse directions in said semiconductor substrate, thereby forming a plurality of semiconductor pillar projections;

forming a second mask including an anti-oxidation film on entire side surfaces of each of said semiconductor pillar projections;

anisotropically etching said semiconductor substrate by using said first and second masks as anti-etching masks to form second grooves in said first grooves, said first grooves thereby having widths larger than those of said second grooves, thereby forming steps at boundaries of said first and second grooves;

forming a first diffusion layer serving as a memory node in side surfaces at a lower portion of each of the semiconductor pillar projections by using a portion of said first and second masks as anti-diffusion masks;

forming a third mask at least on the side surfaces of each of the semiconductor pillar projections and said second mask;

anisotropically etching said second grooves using said third mask as an anti-etching mask to form third grooves in said second grooves, said second grooves thereby having widths larger than those of said third grooves, thereby forming steps at boundaries of said second and third grooves;

forming a second diffusion layer for element isolation in entire bottom portions of said third grooves;

removing said third mask;

forming a capacitor insulating film on the first diffusion layer on the side surfaces at the lower portion of each of the semiconductor pillar projections while said second mask remains;

burying a capacitor electrode in said second grooves;

covering an exposed surface of said capacitor electrode with a first insulating film;

removing said second mask and forming a gate electrode on side surfaces at an upper portion of each of the semiconductor pillar projections with a gate insulating film interposed therebetween;

covering a region except for a surface of said first mask with a second insulating film including a material different from that of said first mask;

removing said first mask to expose an upper end face of each of the semiconductor pillar projections;

forming a third diffusion layer serving as one of a source and a drain in the exposed upper end face of each of the semiconductor pillar projections; and forming and patterning a conductor film to form a bit line to be connected to said third diffusion layer.

3. A method for manufacturing a dynamic RAM, comprising the steps of:

selectively forming a first mask including an antioxidation film on semiconductor substrate;

anisotropically etching said semiconductor substrate by using said first mask to form first grooves in longitudinal and transverse directions in said semiconductor substrate, thereby forming a plurality of semiconductor pillar projections;

forming a second mask including an anti-oxidation film on entire side surfaces of each of said semiconductor pillar projections;

anistropically etching said semiconductor substrate by using said first and second masks as anti-etching masks to form second grooves in said first grooves, said first grooves thereby having widths which are larger than those of said second grooves, thereby forming steps at boundaries of said first and second grooves;

forming a first diffusion layer serving as a memory node in side surfaces at a lower portion of each of the semiconductor pillar projections by using a portion of said first and second masks as anti-diffusion masks;

forming an element isolation layer on entire bottom portions of said second grooves;

forming a capacitor insulating film on the first diffusion layer on the side surfaces at the lower portion of each of the semiconductor pillar projections;

burying a capacitor electrode in said second grooves;

covering an exposed surface of said capacitor electrode with a first insulating film;

removing said second mask to form a gate electrode on the side surfaces at an upper portion of each of the semiconductor pillar projections with a gate insulating film interposed therebetween;

covering an entire surface of said semiconductor substrate, in which said gate electrodes are formed, with a second insulating film to flatten a semiconductor structure;

etching said second insulating film to expose said first mask;

selectively etching and removing said exposed first mask to expose an upper end face of each of the semiconductor pillar projections;

forming a second diffusion layer serving as one of a source and a drain in the exposed upper end face; and forming and patterning a conductor film to form a bit line to be connected to said second diffusion layer.

4. A method for manufacturing a dynamic RAM, comprising the steps of:

forming first and second substrates each having an insulating film thereon;

bringing a first insulating film of said first substrate into contact with a second insulating film of said second substrate, and bonding said first and second insulating films by a wafer bonding technique, thereby forming a bonded wafer;

performing anisotropic etching from a first substrate side by using said bonded wafer as a starting material and said first and second insulating films as etching stoppers, thereby forming grooves in longitudinal and transverse directions in said first substrate to define a plurality of first semiconductor pillar projections separated by said grooves, said performing step including the substeps of:

selectively forming a first mask including an antioxidation film on said first substrate;

anisotropically etching said first substrate by using said first mask to form first grooves in longitudinal and transverse directions in said first substrate, thereby forming a plurality of second semiconductor pillar projections;

forming a second mask including an anti-oxidation film on entire side surfaces of each of said second semiconductor pillar projections; and anisotropically etching said first substrate by using said first and second masks an anti-etching masks to form second grooves in said first grooves, said grooves constituted by said first and second grooves, said first grooves having widths larger than those of said second grooves, thereby forming steps at boundaries of said first and second grooves and forming said plurality of said first semiconductor pillar projections separated by said grooves;

forming a MOS capacitor and a MOSFET at lower and upper portions, respectively, of each of said first semiconductor pillar projections; and connecting a bit line to one of a source and a drain of said MOSFET.

5. A method for manufacturing a dynamic RAM, comprising the steps of:

selectively forming a first mask including an anti-oxidation film on a semiconductor substrate;

anisotropically etching said semiconductor substrate by using said first mask to form first grooves in longitudinal and transverse directions in said first substrate, thereby forming a plurality of first semiconductor pillar projections;

forming a second mask including an anti-oxidation film on entire side surfaces of each of said first semiconductor pillar projections;

anisotropically etching said semiconductor substrate by using said first and second masks as anti-etching masks to form second grooves in said first grooves, thereby forming a plurality of second semiconductor pillar projections, said first grooves having widths larger than those of said second grooves, thereby forming steps at boundaries of said first and second grooves;

forming a MOS capacitor and a MOSFET at lower and upper portions, respectively, of each of said second semiconductor pillar projections;

dividing said second semiconductor pillar projections into a plurality of blocks, and forming a word line contact region on at least selected one of said second semiconductor pillar projections in each of said blocks with an insulating layer interposed therebetween, said dividing step including the substeps of causing said first mask used to form said first grooves to remain on said selected second semiconductor pillar projection, forming a third mask on said selected second semiconductor pillar projection before forming a gate electrode of said MOSFET on the side surface at the upper portion of each second semiconductor pillar projection in a self-alignment manner, and forming said gate electrode by using said third mask, and causing a gate electrode material to remain on said first mask on said selected second semiconductor pillar projection to form said word line contact region;

connecting said gate electrode of each said MOSFET constituted by non-selected second semiconductor pillar projections to said word line contact region via contact holes; and connecting a bit line to one of a source and a drain of each said MOSFET constituted by the non-selected second semiconductor pillar projections.

* * * * *